US008300845B2

(12) United States Patent
Zurek et al.

(10) Patent No.: US 8,300,845 B2
(45) Date of Patent: Oct. 30, 2012

(54) ELECTRONIC APPARATUS HAVING MICROPHONES WITH CONTROLLABLE FRONT-SIDE GAIN AND REAR-SIDE GAIN

(75) Inventors: Robert Zurek, Antioch, IL (US); Kevin Bastyr, St. Francis, WI (US); Joel Clark, Woodridge, IL (US); Plamen Ivanov, Schaumburg, IL (US)

(73) Assignee: Motorola Mobility LLC, Libertyville, IL (US)

( * ) Notice: Subject to any disclaimer, the term of this patent is extended or adjusted under 35 U.S.C. 154(b) by 309 days.

(21) Appl. No.: 12/822,081

(22) Filed: Jun. 23, 2010

(65) Prior Publication Data

US 2011/0317041 A1 Dec. 29, 2011

(51) Int. Cl.

*H04R 3/00* (2006.01)
*H04R 5/02* (2006.01)
*H04R 1/02* (2006.01)
*H04R 9/06* (2006.01)
*H03B 1/00* (2006.01)

(52) U.S. Cl. .......... 381/92; 381/122; 381/123; 381/307; 381/333; 381/334

(58) Field of Classification Search .................... 381/92, 381/333, 334, 306, 207, 111, 122
See application file for complete search history.

(56) References Cited

U.S. PATENT DOCUMENTS

| | | | |
|---|---|---|---|
| 4,308,425 | A | 12/1981 | Momose et al. |
| 4,334,740 | A | 6/1982 | Wray |
| 5,031,216 | A | 7/1991 | Gorike et al. |
| 5,548,335 | A | 8/1996 | Mitsuhashi et al. |
| 6,041,127 | A | 3/2000 | Elko |
| 6,507,659 | B1 | 1/2003 | Iredale et al. |
| 7,020,290 | B1 | 3/2006 | Ribic |
| 2003/0151678 | A1 | 8/2003 | Lee et al. |
| 2003/0160862 | A1 | 8/2003 | Charlier et al. |
| 2004/0116166 | A1 | 6/2004 | Makishima |
| 2005/0140810 | A1 | 6/2005 | Ozawa |
| 2005/0237395 | A1 | 10/2005 | Takenaka et al. |
| 2006/0140417 | A1 | 6/2006 | Zurek |
| 2006/0269080 | A1 | 11/2006 | Oxford et al. |
| 2008/0075298 | A1 | 3/2008 | Mori |

(Continued)

FOREIGN PATENT DOCUMENTS

JP 2-206975 A 8/1990

OTHER PUBLICATIONS

Patent Cooperation Treaty, "PCT Search Report and Written Opinion of the International Searching Authority" for International Application No. PCT/US2011/037632, Aug. 19, 2011, 12 pages.

(Continued)

*Primary Examiner* — Vivian Chin
*Assistant Examiner* — Douglas Suthers
(74) *Attorney, Agent, or Firm* — Ingrassia Fisher & Lorenz, PC; Erin P. Madill; Sylvia Chan

(57) ABSTRACT

An electronic apparatus is provided that has a rear-side and a front-side, a first microphone that generates a first signal, and a second microphone that generates a second signal. An automated balance controller generates a balancing signal based on an imaging signal. A processor processes the first and second signals to generate at least one beamformed audio signal, where an audio level difference between a front-side gain and a rear-side gain of the beamformed audio signal is controlled during processing based on the balancing signal.

18 Claims, 25 Drawing Sheets

U.S. PATENT DOCUMENTS

| | | | |
|---|---|---|---|
| 2008/0170718 | A1 | 7/2008 | Faller |
| 2008/0247567 | A1 | 10/2008 | Kjolerbakken et al. |
| 2009/0010453 | A1 | 1/2009 | Zurek et al. |
| 2009/0303350 | A1 | 12/2009 | Terada |
| 2010/0110232 | A1 | 5/2010 | Zhang et al. |
| 2010/0123785 | A1 | 5/2010 | Chen et al. |

OTHER PUBLICATIONS

Gary W. Elko, "Superdirectional Microphone Arrays" and Yiteng (Arden) Huang, et al., "Microphone Arrays for Video Camera Steering" in Steven L. Gay and Jacob Benesty (editors), "Acoustic Signal Processing for Telecommunication", 2000, pp. 181-237 and 239-259, Kluwer Academic Publishers.

ELECTRONIC APPARATUS HAVING MICROPHONES WITH CONTROLLABLE FRONT-SIDE GAIN AND REAR-SIDE GAIN

TECHNICAL FIELD

The present invention generally relates to electronic devices, and more particularly to electronic devices having the capability to acquire spatial audio information.

BACKGROUND

Portable electronic devices that have multimedia capability have become more popular in recent times. Many such devices include audio and video recording functionality that allow them to operate as handheld, portable audio-video (AV) systems. Examples of portable electronic devices that have such capability include, for example, digital wireless cellular phones and other types of wireless communication devices, personal digital assistants, digital cameras, video recorders, etc.

Some portable electronic devices include one or more microphones that can be used to acquire audio information from an operator of the device and/or from a subject that is being recorded. In some cases, two or more microphones are provided on different sides of the device with one microphone positioned for recording the subject and the other microphone positioned for recording the operator. However, because the operator is usually closer than the subject to the device's microphone(s), the audio level of an audio input received from the operator will often exceed the audio level of the subject that is being recorded. As a result, the operator will often be recorded at a much higher audio level than the subject unless the operator self-adjusts his volume (e.g., speaks very quietly to avoid overpowering the audio level of the subject). This problem can exacerbated in devices using omnidirectional microphone capsules.

Accordingly, it is desirable to provide improved electronic devices having the capability to acquire audio information from more than one source (e.g., subject and operator) that can be located on different sides of the device. It is also desirable to provide methods and systems within such devices for balancing the audio levels of both sources at appropriate audio levels regardless of their distances from the device. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

As used herein, the word "exemplary" means "serving as an example, instance, or illustration." The following detailed description is merely exemplary in nature and is not intended to limit the invention or the application and uses of the invention. Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following Before describing in detail embodiments that are in accordance with the present invention, it should be observed that the embodiments reside primarily in an electronic apparatus that has a rear-side and a front-side, a first microphone that generates a first output signal, and a second microphone that generates a second output signal. An automated balance controller is provided that generates a balancing signal based on an imaging signal. A processor processes the first and second output signals to generate at least one beamformed audio signal, where an audio level difference between a front-side gain and a rear-side gain of the beamformed audio signal is controlled during processing based on the balancing signal.

Figure 1A:
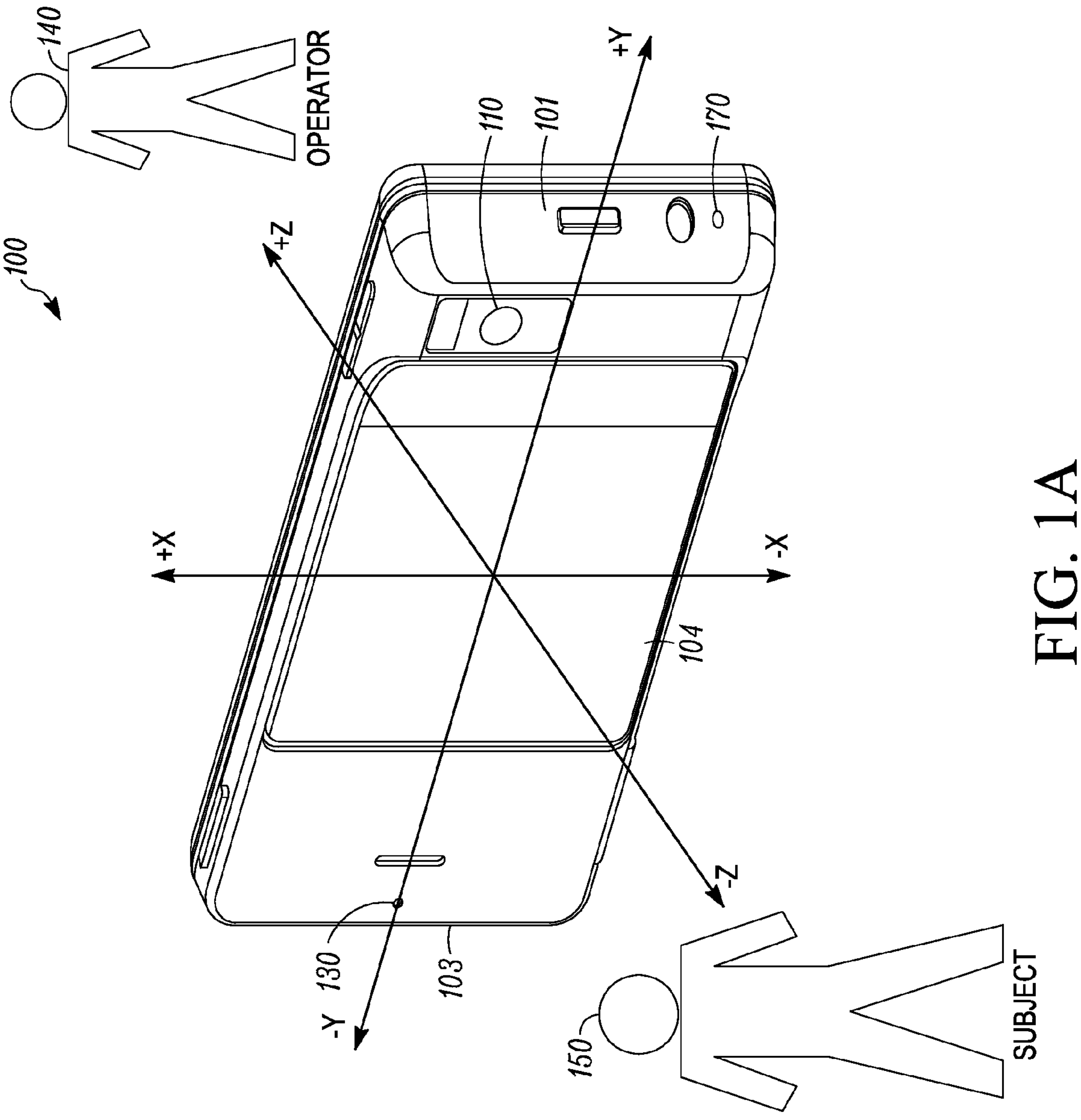
FIG. 1A is a front perspective view of an electronic apparatus in accordance with one exemplary implementation of the disclosed embodiments.
Figure 1B:
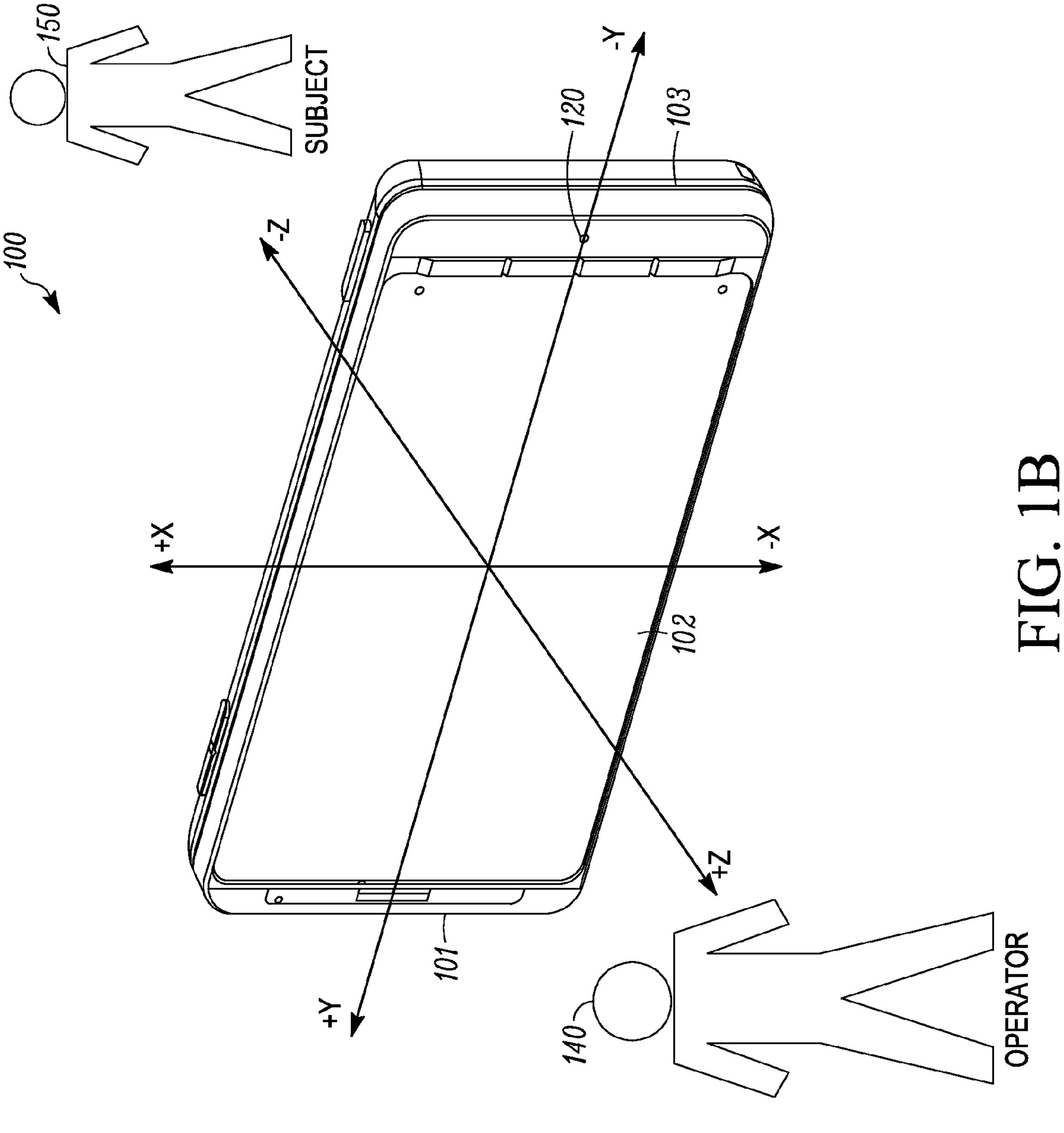
FIG. 1B is a rear perspective view of the electronic apparatus of FIG. 1A.
Figure 2B:
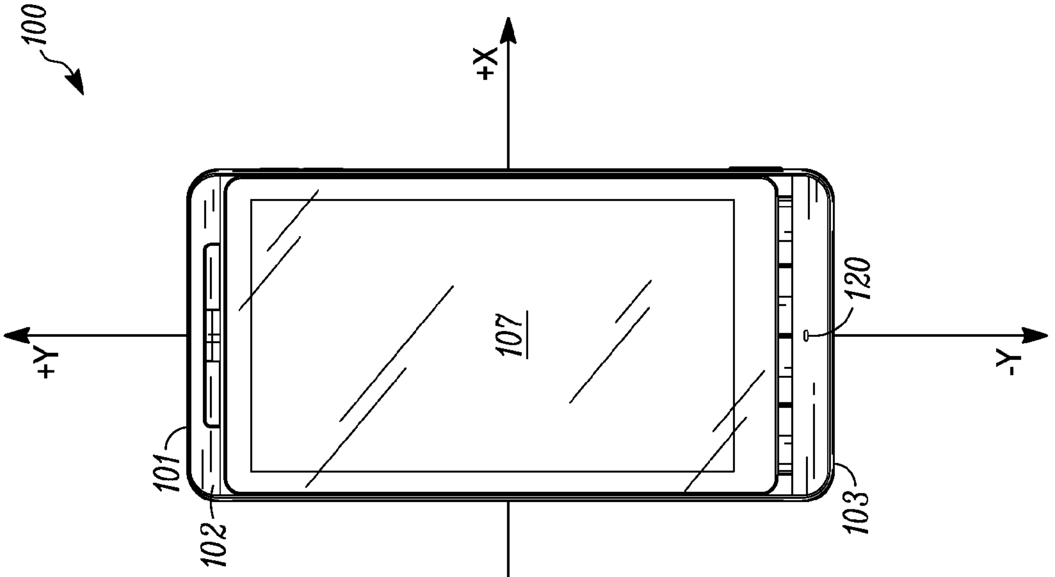
FIG. 2B is a rear view of the electronic apparatus of FIG. 1A.
Figure 2A:
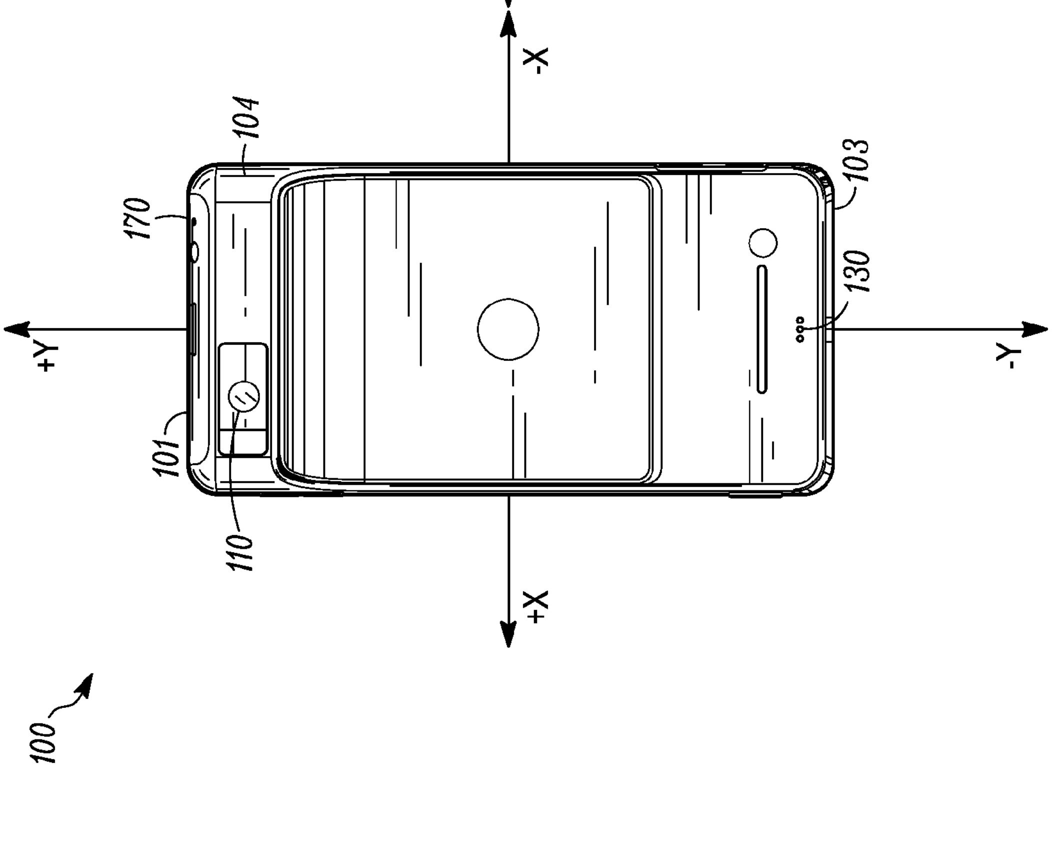
FIG. 2A is a front view of the electronic apparatus of FIG. 1A.

Prior to describing the electronic apparatus with reference to FIGS. 3-13, one example of an electronic apparatus and an operating environment will be described with reference to FIGS. 1A-2B. FIG. 1A is a front perspective view of an electronic apparatus 100 in accordance with one exemplary implementation of the disclosed embodiments. FIG. 1B is a rear perspective view of the electronic apparatus 100. The perspective view in FIGS. 1A and 1B are illustrated with reference to an operator 140 of the electronic apparatus 100 that is recording a subject 150. FIG. 2A is a front view of the electronic apparatus 100 and FIG. 2B is a rear view of the electronic apparatus 100.

The electronic apparatus 100 can be any type of electronic apparatus having multimedia recording capability. For example, the electronic apparatus 100 can be any type of portable electronic device with audio/video recording capability including a camcorder, a still camera, a personal media recorder and player, or a portable wireless computing device. As used herein, the term "wireless computing device" refers to any portable computer or other hardware designed to communicate with an infrastructure device over an air interface through a wireless channel. A wireless computing device is "portable" and potentially mobile or "nomadic" meaning that the wireless computing device can physically move around, but at any given time may be mobile or stationary. A wireless computing device can be one of any of a number of types of mobile computing devices, which include without limitation, mobile stations (e.g. cellular telephone handsets, mobile radios, mobile computers, hand-held or laptop devices and personal computers, personal digital assistants (PDAs), or the like), access terminals, subscriber stations, user equipment, or any other devices configured to communicate via wireless communications.

The electronic apparatus 100 has a housing 102, 104, a left-side portion 101, and a right-side portion 103 opposite the left-side portion 101. The housing 102, 104 has a width dimension extending in an y-direction, a length dimension extending in a x-direction, and a thickness dimension extending in a z-direction (into and out of the page). The rear-side is oriented in a +z-direction and the front-side oriented in a −z-direction. Of course, as the electronic apparatus is re-oriented, the designations of "right", "left", "width", and "length" may be changed. The current designations are given for the sake of convenience.

More specifically, the housing includes a rear housing 102 on the operator-side or rear-side of the apparatus 100, and a front housing 104 on the subject-side or front-side of the apparatus 100. The rear housing 102 and front housing 104 are assembled to form an enclosure for various components including a circuit board (not illustrated), an earpiece speaker (not illustrated), an antenna (not illustrated), a video camera 110, and a user interface 107 including microphones 120, 130, 170 that are coupled to the circuit board.

The housing includes a plurality of ports for the video camera 110 and the microphones 120, 130, 170. Specifically, the rear housing 102 includes a first port for a rear-side microphone 120, and the front housing 104 has a second port for a front-side microphone 130. The first port and second port share an axis. The first microphone 120 is disposed along the axis and at/near the first port of the rear housing 102, and the second microphone 130 is disposed along the axis opposing the first microphone 120 and at/near the second port of the front housing 104.

Optionally, in some implementations, the front housing 104 of the apparatus 100 may include the third port in the front housing 104 for another microphone 170, and a fourth port for video camera 110. The third microphone 170 is disposed at/near the third port. The video camera 110 is positioned on the front-side and thus oriented in the same direction of the front housing 104, opposite the operator, to allow for images of the subject to be acquired as the subject is being recorded by the camera. An axis through the first and second ports may align with a center of a video frame of the video camera 110 positioned on the front housing.

The left-side portion 101 is defined by and shared between the rear housing 102 and the front housing 104, and oriented in a +y-direction that is substantially perpendicular with respect to the rear housing 102 and the front housing 104. The right-side portion 103 is opposite the left-side portion 101, and is defined by and shared between the rear housing 102 and the front housing 104. The right-side portion 103 is oriented in a −y-direction that is substantially perpendicular with respect to the rear housing 102 and the front housing 104.

Figure 3:
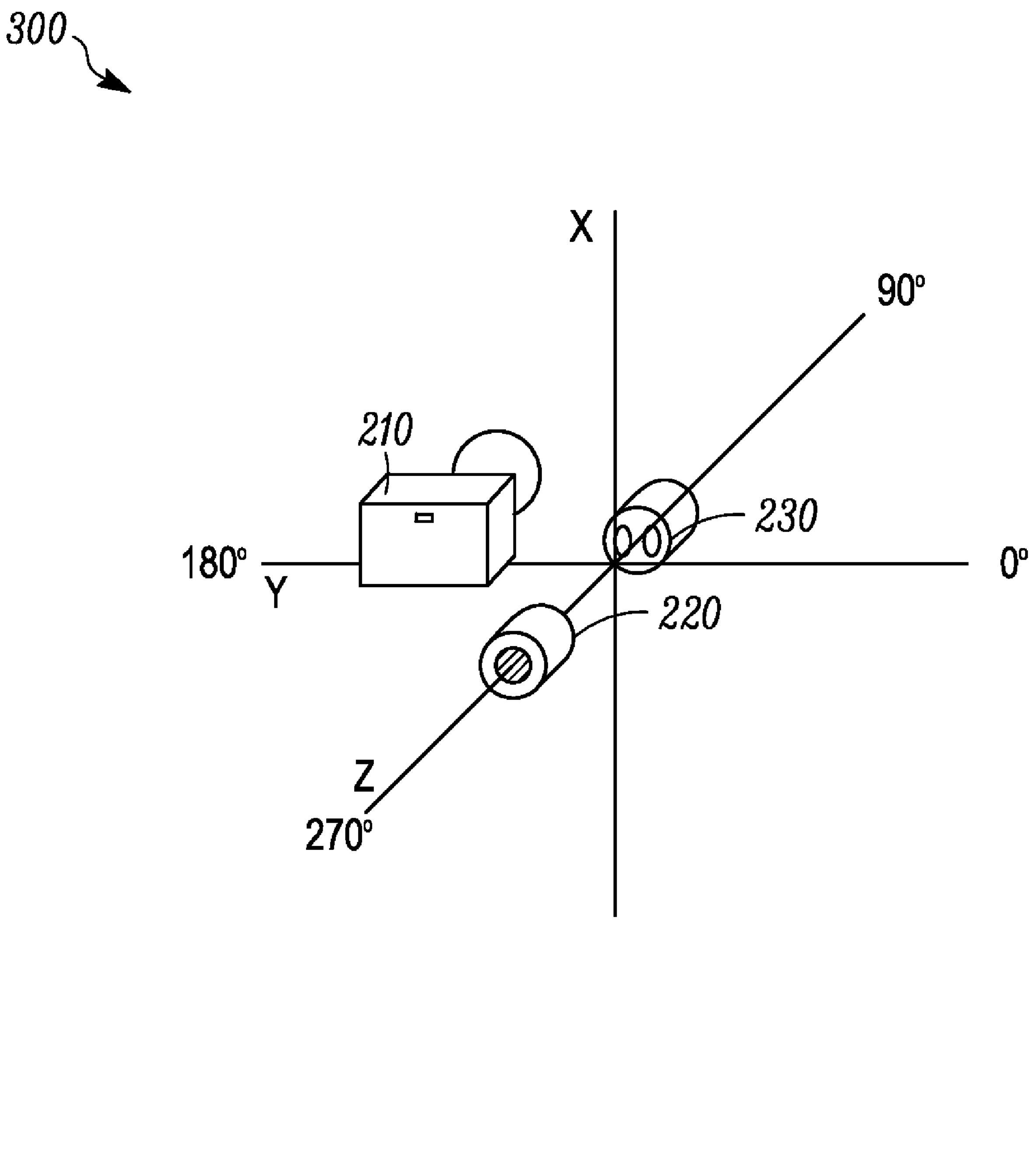
FIG. 3 is a schematic of a microphone and video camera configuration of the electronic apparatus in accordance with some of the disclosed embodiments.

FIG. 3 is a schematic of a microphone and video camera configuration 300 of the electronic apparatus in accordance with some of the disclosed embodiments. The configuration 300 is illustrated with reference to a Cartesian coordinate system and includes the relative locations of a rear-side microphone 220 with respect to a front-side microphone 230 and video camera 210. The microphones 220, 230 are located or oriented along a common z-axis and separated by 180 degrees along a line at 90 degrees and 270 degrees. The first physical microphone element 220 is on an operator or rear-side of portable electronic apparatus 100, and the second physical microphone element 230 is on the subject or front-side of the electronic apparatus 100. The y-axis is oriented along a line at zero and 180 degrees, and the x-axis is oriented perpendicular to the y-axis and the z-axis in an upward direction. The camera 210 is located along the y-axis and points into the page in the −z-direction towards the subject in front of the device as does the front-side microphone 230. The subject (not shown) would be located in front of the front-side microphone 230, and the operator (not shown) would be located behind the rear-side microphone 220. This way the microphones are oriented such that they can capture audio signals or sound from the operator taking the video and as well as from a subject being recorded by the video camera 210.

The physical microphones 220, 230 can be any known type of physical microphone elements including omnidirectional microphones, directional microphones, pressure microphones, pressure gradient microphones, or any other acoustic-to-electric transducer or sensor that converts sound into an electrical audio signal, etc. In one embodiment, where the physical microphone elements 220, 230 are omnidirectional physical microphone elements (OPMEs), they will have omnidirectional polar patterns that sense/capture incoming sound more or less equally from all directions. In one implementation, the physical microphones 220, 230 can be part of a microphone array that is processed using beamforming techniques, such as delaying and summing (or delaying and differencing), to establish directional patterns based on outputs generated by the physical microphones 220, 230.

As will now be described with reference to FIGS. 4-5E, the rear-side gain corresponding to the operator can be controlled and attenuated relative to the front-side gain of the subject so that the operator audio level does not overpower the subject audio level.

Figure 4:
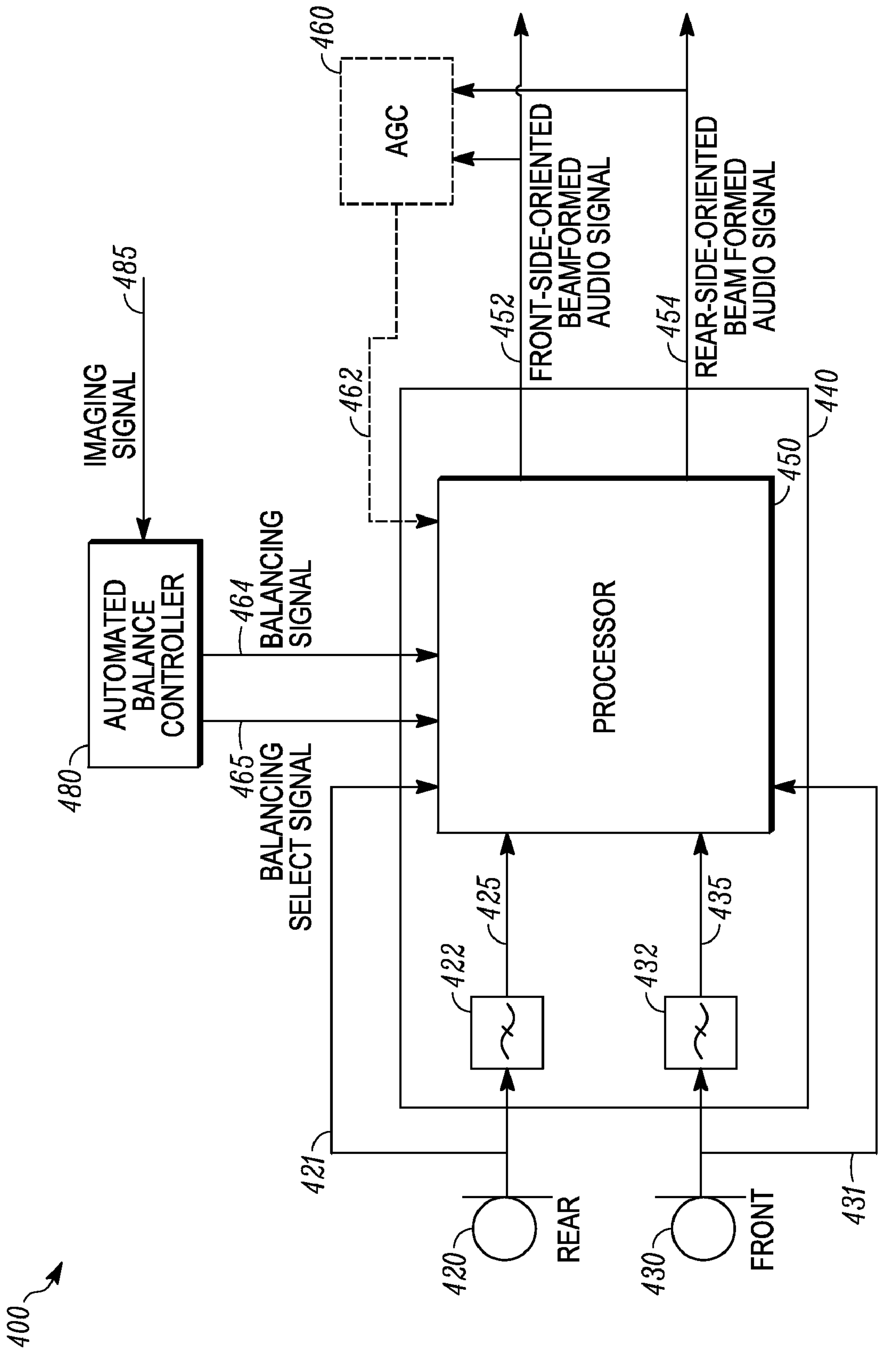
FIG. 4 is a block diagram of an audio processing system of an electronic apparatus in accordance with some of the disclosed embodiments.

FIG. 4 is a block diagram of an audio processing system 400 of an electronic apparatus 100 in accordance with some of the disclosed embodiments.

The audio processing system 400 includes a microphone array that includes a first microphone 420 that generates a first signal 421 in response to incoming sound, and a second microphone 430 that generates a second signal 431 in response to the incoming sound. These electrical signals are generally a voltage signal that corresponds to a sound pressure captured at the microphones.

A first filtering module 422 is designed to filter the first signal 421 to generate a first phase-delayed audio signal 425 (e.g., a phase delayed version of the first signal 421), and a second filtering module 432 designed to filter the second signal 431 to generate a second phase-delayed audio signal 435. Although the first filtering module 422 and the second filtering module 432 are illustrated as being separate from processor 450, it is noted that in other implementations the first filtering module 422 and the second filtering module 432 can be implemented within the processor 450 as indicated by the dashed-line rectangle 440.

The automated balance controller 480 generates a balancing signal 464 based on an imaging signal 485. Depending on the implementation, the imaging signal 485 can be provided from any one of number of different sources, as will be described in greater detail below. In one implementation, the video camera 110 is coupled to the automated balance controller 480.

The processor 450 receives a plurality of input signals including the first signal 421, the first phase-delayed audio signal 425, the second signal 431, and the second phase-delayed audio signal 435. The processor 450 processes these input signals 421, 425, 431, 435, based on the balancing signal 464 (and possibly based on other signals such as the balancing select signal 465 or an AGC signal 462), to generate a front-side-oriented beamformed audio signal 452 and a rear-side-oriented beamformed audio signal 454. As will be described below, the balancing signal 464 can be used to control an audio level difference between a front-side gain of the front-side-oriented beamformed audio signal 452 and a rear-side gain of the rear-side-oriented beamformed audio signal 454 during beamform processing. This allows for control of the audio levels of a subject-oriented virtual microphone with respect to an operator-oriented virtual microphone. The beamform processing performed by the processor 450 can be delay and sum processing, delay and difference processing, or any other known beamform processing technique for generating directional patterns based on microphone input signals. Techniques for generating such first order beamforms are well-known in the art and will not be described herein. First order beamforms are those which follow the form $A+B\cos(\theta)$ in their directional characteristics; where A and B are constants representing the omnidirectional and bidirectional components of the beamformed signal and $\theta$ is the angle of incidence of the acoustic wave.

In one implementation, the balancing signal 464 can be used to determine a ratio of a first gain of the rear-side-oriented beamformed audio signal 454 with respect to a second gain of the front-side-oriented beamformed audio signal 452. In other words, the balancing signal 464 will determine the relative weighting of the first gain with respect to the second gain such that sound waves emanating from a front-side audio output are emphasized with respect to other sound waves emanating from a rear-side audio output during playback of the beamformed audio signals 452, 454. The relative gain of the rear-side-oriented beamformed audio signal 454 with respect to the front-side-oriented beamformed audio signal 452 can be controlled during processing based on the balancing signal 464. To do so, in one implementation, the gain of the rear-side-oriented beamformed audio signal 454 and/or the gain of the front-side-oriented beamformed audio signal 452 can be varied. For instance, in one implementation, the rear and front portions are adjusted so that they are substantially balanced so that the operator audio will not dominate over the subject audio.

In one implementation, the processor 450 can include a look up table (LUT) that receives the input signals and the balancing signal 464, and generates the front-side-oriented beamformed audio signal 452 and the rear-side-oriented beamformed audio signal 454. The LUT is table of values that generates different signals 452, 454 depending on the values of the balancing signal 464.

In another implementation, the processor 450 is designed to process an equation based on the input signals 421, 425, 431, 435 and the balancing signal 464 to generate the front-side-oriented beamformed audio signal 452 and a rear-side-oriented beamformed audio signal 454. The equation includes coefficients for the first signal 421, the first phase-delayed audio signal 425, the second signal 431 and the second phase-delayed audio signal 435, and the values of these coefficients can be adjusted or controlled based on the balancing signal 454 to generate a gain-adjusted front-side-oriented beamformed audio signal 452 and/or a gain adjusted the rear-side-oriented beamformed audio signal 454.

Examples of gain control will now be described with reference to FIGS. 5A-5E. Preliminarily, it is noted that in any of the polar graphs described below, signal magnitudes are plotted linearly to show the directional or angular response of a particular signal. Further, in the examples that follow, for purposes of illustration of one example, it can be assumed that the subject is generally located at approximately 90° while the operator is located at approximately 270°. The directional patterns shown in FIGS. 5A-5E are slices through the directional response forming a plane as would be observed by a viewer who located above the electronic apparatus 100 of FIG. 1 who is looking downward, where the z-axis in FIG. 3 corresponds to the 90°-270° line, and the y-axis in FIG. 3 corresponds to the 0°-180° line.

Figure 5A:
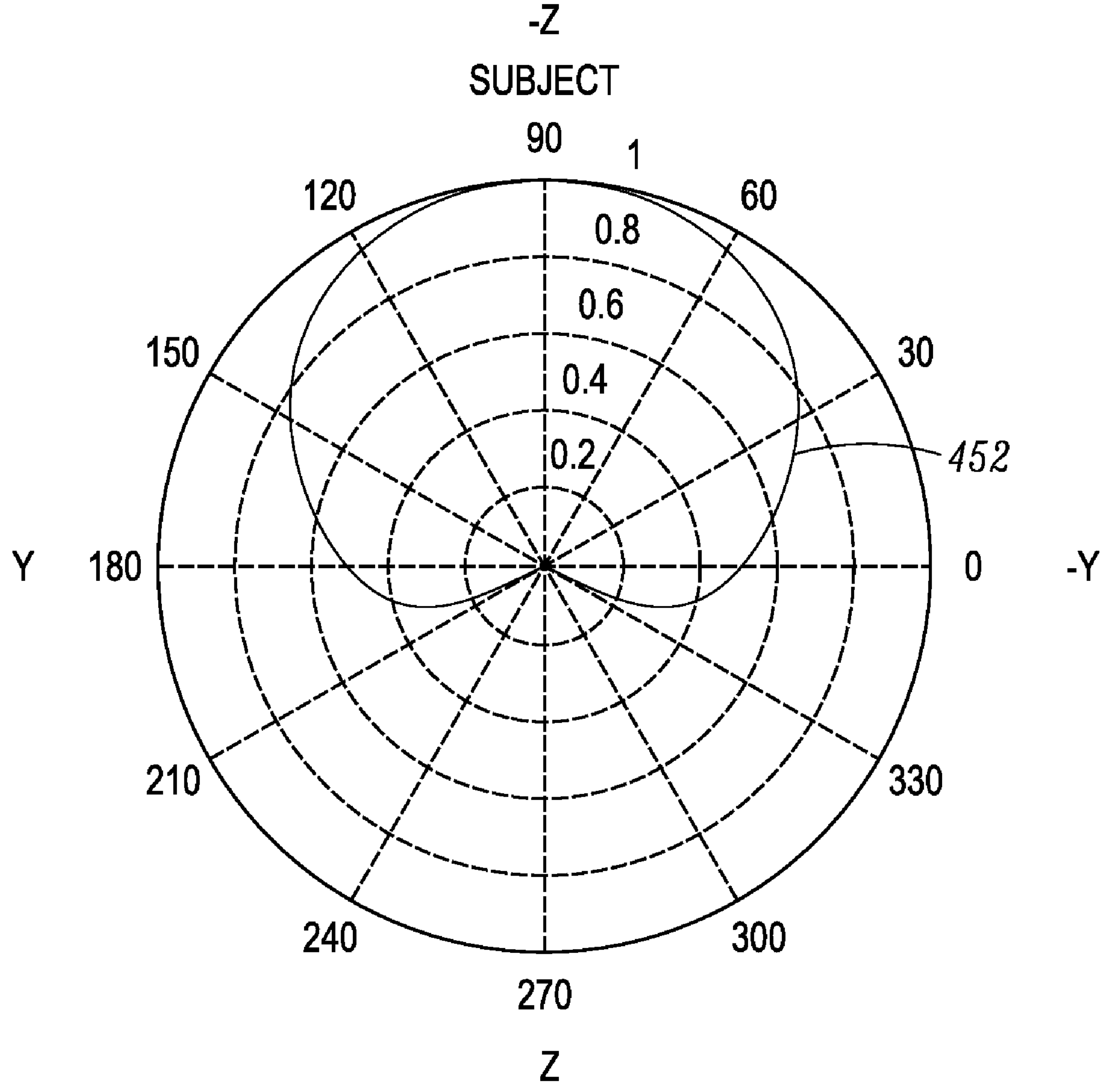
FIG. 5A is an exemplary polar graph of a front-side-oriented beamformed audio signal generated by the audio processing system in accordance with one implementation of some of the disclosed embodiments.

FIG. 5A is an exemplary polar graph of a front-side-oriented beamformed audio signal 452 generated by the audio processing system 400 in accordance with one implementation of some of the disclosed embodiments. As illustrated in FIG. 5A, the front-side-oriented beamformed audio signal 452 has a first-order cardioid directional pattern that is oriented or points towards the subject in the −z-direction or in front of the device. This first-order directional pattern has a maximum at 90 degrees and has a relatively strong directional sensitivity to sound originating from the direction of the subject. The front-side-oriented beamformed audio signal 452 also has a null at 270 degrees that points towards the operator (in the +z-direction) who is recording the subject, which indicates that there is little of no directional sensitivity to sound originating from the direction of the operator. Stated differently, the front-side-oriented beamformed audio signal 452 emphasizes sound waves emanating from in front of the device and has a null oriented towards the rear of the device.

Figure 5B:
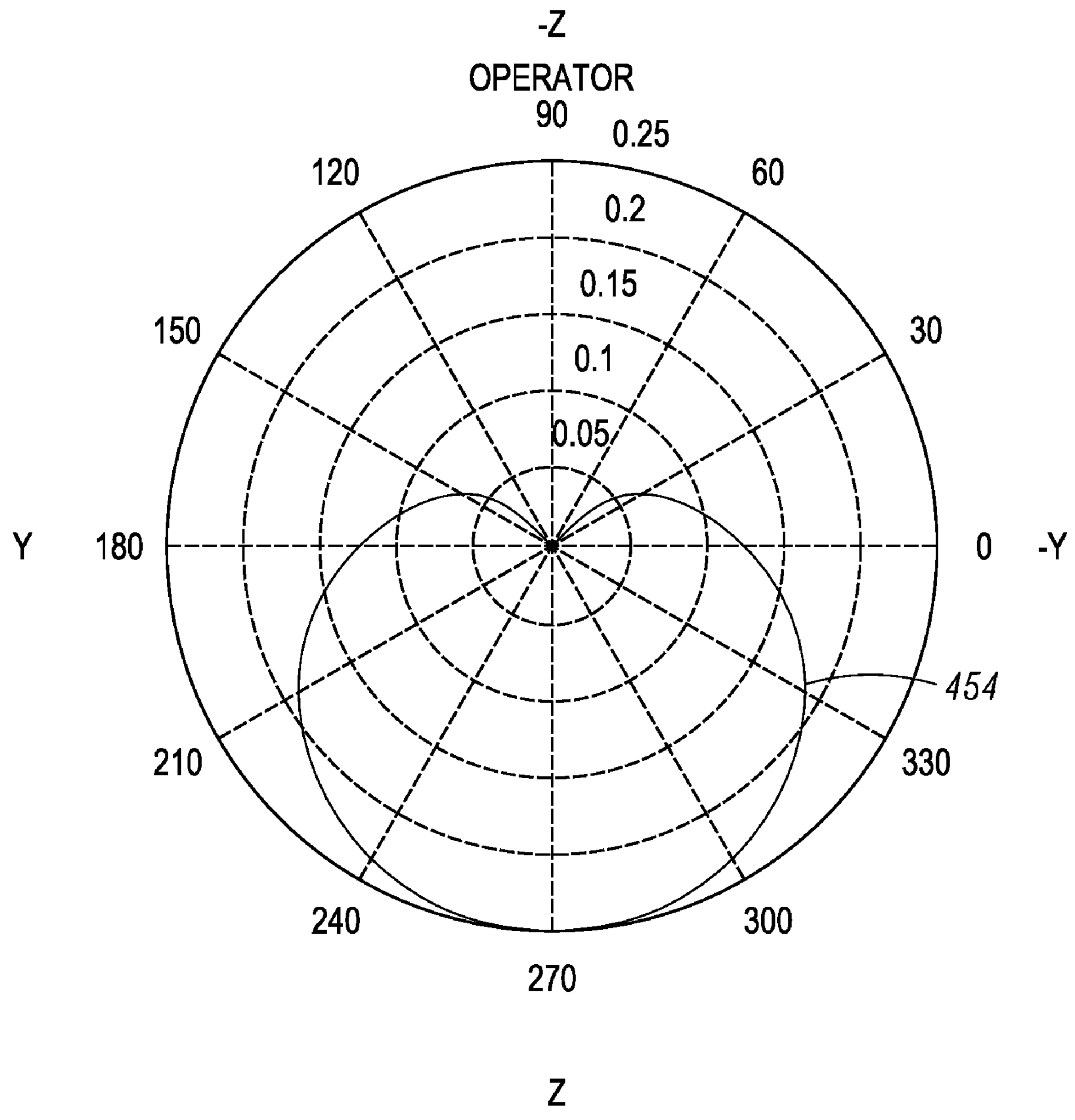
FIG. 5B is an exemplary polar graph of a rear-side-oriented beamformed audio signal generated by the audio processing system in accordance with one implementation of some of the disclosed embodiments.

FIG. 5B is an exemplary polar graph of a rear-side-oriented beamformed audio signal 454 generated by the audio processing system 400 in accordance with one implementation of some of the disclosed embodiments. As illustrated in FIG. 5B, the rear-side-oriented beamformed audio signal 454 also has a first-order cardioid directional pattern but it points or is oriented towards the operator in the +z-direction behind the device, and has a maximum at 270 degrees. This indicates that there is strong directional sensitivity to sound originating from the direction of the operator. The rear-side-oriented beamformed audio signal 454 also has a null (at 90 degrees) that points towards the subject (in the −z-direction), which indicates that there is little or no directional sensitivity to sound originating from the direction of the subject. Stated differently, the rear-side-oriented beamformed audio signal 454 emphasizes sound waves emanating from behind the device and has a null oriented towards the front of the device.

Although not illustrated in FIG. 4, in some embodiments, the beamformed audio signals 452, 454 can be combined into a single channel audio output signal that can be transmitted and/or recorded. For ease of illustration, both the responses of a front-side-oriented beamformed audio signal 452 and a rear-side-oriented beamformed audio signal 454 will be shown together, but it is noted that this is not intended to necessarily imply that the beamformed audio signals 452, 454 have to be combined.

Figure 5C:
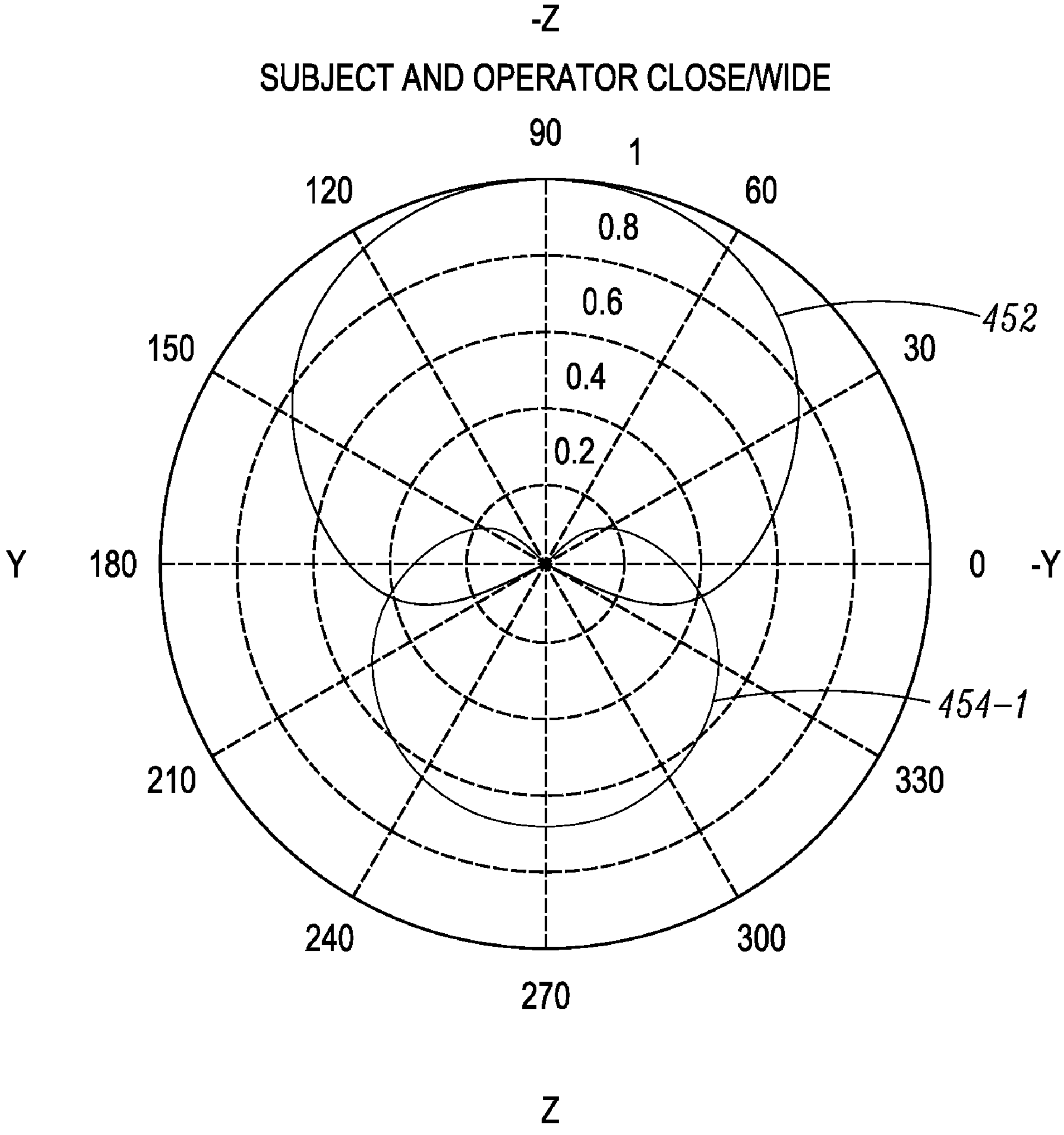
FIG. 5C is an exemplary polar graph of a front-side-oriented beamformed audio signal and a rear-side-oriented beamformed audio signal generated by the audio processing system in accordance with one implementation of some of the disclosed embodiments.

FIG. 5C is an exemplary polar graph of a front-side-oriented beamformed audio signal 452 and a rear-side-oriented beamformed audio signal 454-1 generated by the audio processing system 400 in accordance with one implementation of some of the disclosed embodiments. In comparison to FIG. 5B, the directional response of the operator's virtual microphone illustrated in FIG. 5C has been attenuated relative to the directional response of the subject's virtual microphone to avoid the operator audio level from overpowering the subject audio level. These settings could be used in a situation where the subject is located at a relatively close distance away from the electronic apparatus 100 as indicated by the balancing signal 464.

Figure 5D:
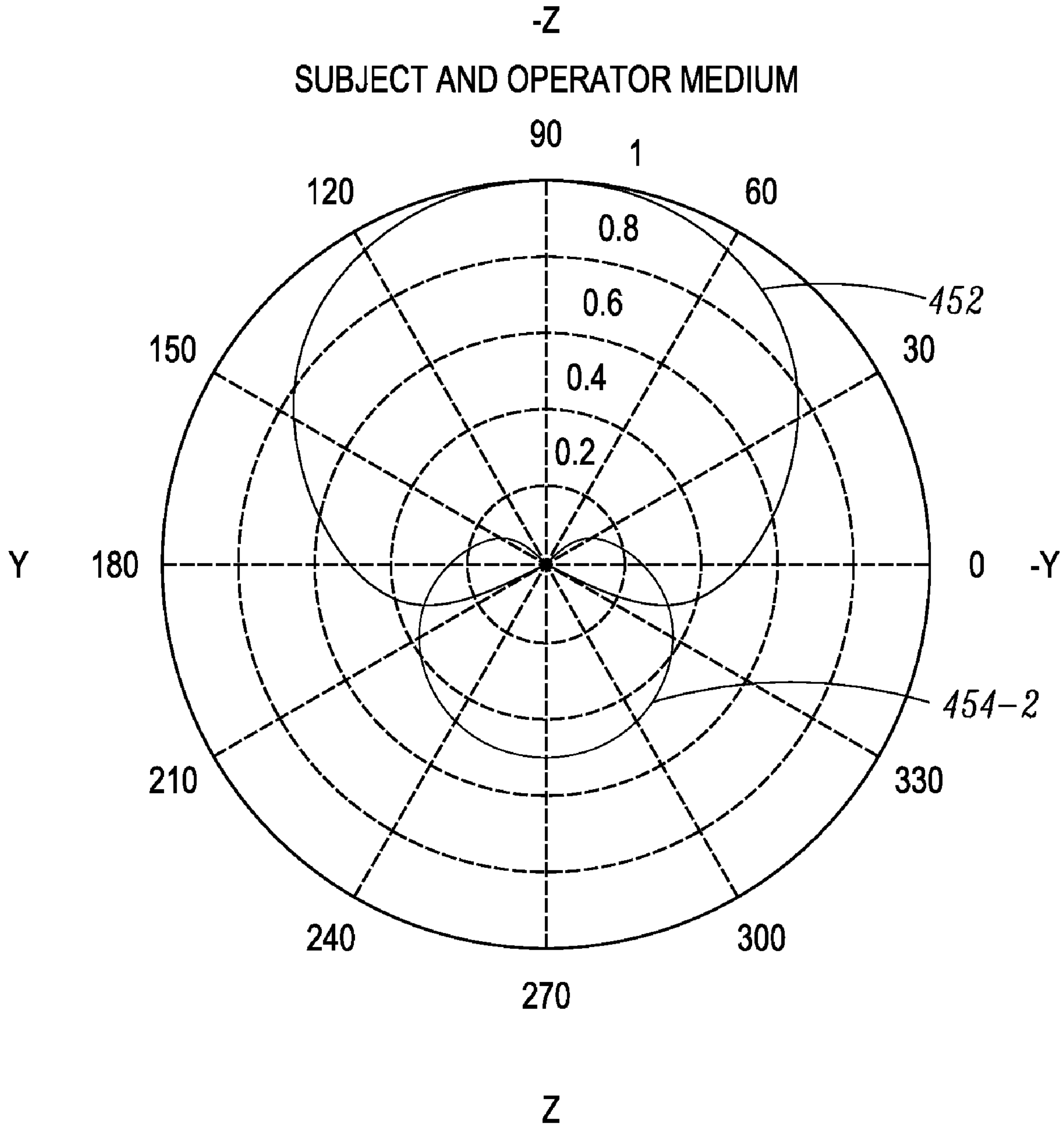
FIG. 5D is an exemplary polar graph of a front-side-oriented beamformed audio signal and a rear-side-oriented beamformed audio signal generated by the audio processing system in accordance with another implementation of some of the disclosed embodiments.

FIG. 5D is an exemplary polar graph of a front-side-oriented beamformed audio signal 452 and a rear-side-oriented beamformed audio signal 454-2 generated by the audio processing system 400 in accordance with another implementation of some of the disclosed embodiments. In comparison to FIG. 5C, the directional response of the operator's virtual microphone illustrated in FIG. 5D has been attenuated even more relative to the directional response of the subject's virtual microphone to avoid the operator audio level from overpowering the subject audio level. These settings could be used in a situation where the subject is located at a relatively medium distance away from the electronic apparatus 100 as indicated by the balancing signal 464.

Figure 5E:
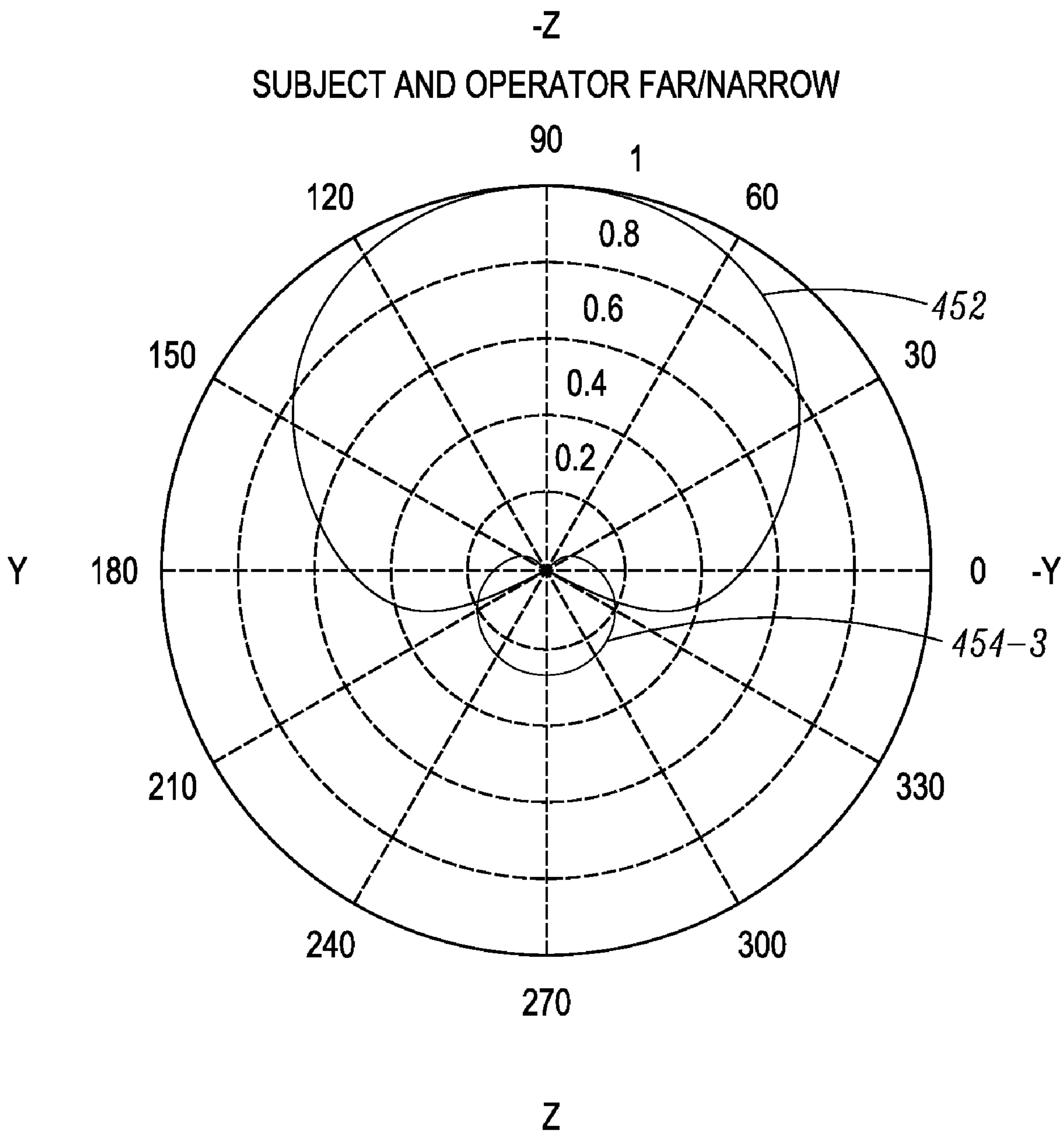
FIG. 5E is an exemplary polar graph of a front-side-oriented beamformed audio signal and a rear-side-oriented beamformed audio signal generated by the audio processing system in accordance with yet another implementation of some of the disclosed embodiments.

FIG. 5E is an exemplary polar graph of a front-side-oriented beamformed audio signal 452 and a rear-side-oriented beamformed audio signal 454-3 generated by the audio processing system 400 in accordance with yet another implementation of some of the disclosed embodiments. In comparison to FIG. 5D, the directional response of the operator's virtual microphone illustrated in FIG. 5E has been attenuated even more relative to the directional response of the subject's virtual microphone to avoid the operator audio level from overpowering the subject audio level. These settings could be used in a situation where the subject is located at a relatively far distance away from the electronic apparatus 100 as indicated by the balancing signal 464.

Thus, FIGS. 5C-5E generally illustrate that the relative gain of the rear-side-oriented beamformed audio signal 454 with respect to the front-side-oriented beamformed audio signal 452 can be controlled or adjusted during processing based on the balancing signal 464. This way the ratio of gains of the first and second beamformed audio signals 452, 454 can be controlled so that one does not dominate the other.

In one implementation, the relative gain of the first beamformed audio signal 452 can be increased with respect to the gain of the second beamformed audio signal 454 so that the audio level corresponding to the operator is less than or equal to the audio level corresponding to the subject (e.g., a ratio of subject audio level to operator audio level is greater than or equal to one). This is another way to adjust the processing so that the audio level of the operator will not overpower that of the subject.

Although the beamformed audio signals 452, 454 shown in FIG. 5A through 5E are both beamformed first order cardioid directional beamform patterns that are either rear-side-oriented or front-side-oriented, those skilled in the art will appreciate that the beamformed audio signals 452, 454 are not necessarily limited to having these particular types of first order cardioid directional patterns and that they are shown to illustrate one exemplary implementation. In other words, although the directional patterns are cardioid-shaped, this does not necessarily imply the beamformed audio signals are limited to having a cardioid shape, and may have any other shape that is associated with first order directional beamform patterns such as a dipole, hypercardioid, supercardioid, etc. Depending on the balancing signal 464, the directional patterns can range from a nearly cardioid beamform to a nearly bidirectional beamform, or from a nearly cardioid beamform to a nearly omnidirectional beamform. Alternatively a higher order directional beamform could be used in place of the first order directional beamform.

Moreover, although the beamformed audio signals 452, 454 are illustrated as having cardioid directional patterns, it will be appreciated by those skilled in the art, that these are mathematically ideal examples only and that, in some practical implementations, these idealized beamform patterns will not necessarily be achieved.

As noted above, the balancing signal 464, the balance select signal 465, and/or the AGC signal 462 can be used to control the audio level difference between a front-side gain of the front-side-oriented beamformed audio signal 452 and a rear-side gain of the rear-side-oriented beamformed audio signal 454 during beamform processing. Each of these signals will now be described in greater detail for various implementations.

Balancing Signal and Examples of Imaging Control Signals That Can Be Used to Generate the Balancing Signal The imaging signal 485 used to determine the balancing signal 464, can vary depending on the implementation. For instance, in some embodiments, the automated balance controller 480 can be a video controller (not shown) that is coupled to the video camera 110, or can be coupled to a video controller that is coupled to the video camera 110. The imaging signal 485 sent to the automated balance controller 480 to generate the balancing signal 464 can be determined from (or can be determined based on) one or more of (1) a zoom control signal for the video camera 110, (2) a focal distance for the video camera 110, or (3) an angular field of view of a video frame of the video camera 110. Any of these parameters can be used alone or in combination with the others to generate a balancing signal 464.

Zoom Control-Based Balancing Signals

In some implementations, the physical video zoom of the video camera 110 is used to determine or set the audio level difference between the front-side gain and the rear-side gain. This way the video zoom control can be linked with a corresponding "audio zoom". In most embodiments, a narrow zoom (or high zoom value) can be assumed to relate to a far distance between the subject and operator, whereas a wide zoom (or low zoom value) can be assumed to relate to a closer distance between the subject and operator. As such, the audio level difference between the front-side gain and the rear-side gain increases as the zoom control signal is increased or as the angular field of view is narrowed. By contrast, the audio level difference between the front-side gain and the rear-side gain decreases as the zoom control signal is decreased or as the angular field of view is widened. In one implementation, the audio level difference between the front-side gain and the rear-side gain can be determined from a lookup table for a particular value of the zoom control signal. In another implementation, the audio level difference between the front-side gain and the rear-side gain can be determined from a function relating the value of a zoom control signal to distance.

In some embodiments, the balancing signal 464 can be a zoom control signal for the video camera 110 (or can be derived based on a zoom control signal for the video camera 110 that is sent to the automated balance controller 480). The zoom control signal can be a digital zoom control signal that controls an apparent angle of view of the video camera, or an optical/analog zoom control signal that controls position of lenses in the camera. In one implementation, preset first order beamform values can be assigned for particular values (or ranges of values) of the zoom control signal to determine an appropriate subject-to-operator audio mixing.

In some embodiments, the zoom control signal for the video camera can be controlled by a user interface (UI). Any known video zoom UI methodology can be used to generate a zoom control signal. For example, in some embodiments, the video zoom can be controlled by the operator via a pair of buttons, a rocker control, virtual controls on the display of the device including a dragged selection of an area, by eye tracking of the operator, etc.

Focal Distance-Based and Field of View-Based Balancing Signals

Focal distance information from the camera 110 to the subject 150 can be obtained from a video controller for the video camera 110 or any other distance determination circuitry in the device. As such, in other implementations, focal distance of the video camera 110 can be used to set the audio level difference between the front-side gain and the rear-side gain. In one implementation, the balancing signal 464 can be a calculated focal distance of the video camera 110 that is sent to the automated balance controller 480 by a video controller.

In still other implementations, the audio level difference between the front-side gain and the rear-side gain can be set based on an angular field of view of a video frame of the video camera 110 that is calculated and sent to the automated balance controller 480.

Proximity-Based Balancing Signals

In other implementations, the balancing signal 464 can be based on estimated, measured, or sensed distance between the operator and the electronic apparatus 100, and/or based on the estimated, measured, or sensed distance between the subject and the electronic apparatus 100.

In some embodiments, the electronic apparatus 100 includes proximity sensor(s) (infrared, ultrasonic, etc.), proximity detection circuits or other type of distance measurement device(s) (not shown) that can be the source of proximity information provided as the imaging signal 485. For example, a front-side proximity sensor can generate a front-side proximity sensor signal that corresponds to a first distance between a video subject 150 and the apparatus 100, and a rear-side proximity sensor can generate a rear-side proximity sensor signal that corresponds to a second distance between a camera 110 operator 140 and the apparatus 100. The imaging signal 485 sent to the automated balance controller 480 to generate the balancing signal 464 is based on the front-side proximity sensor signal and/or the rear-side proximity sensor signal.

In one embodiment, the balancing signal 464 can be determined from estimated, measured, or sensed distance information that is indicative of distance between the electronic apparatus 100 and a subject that is being recorded by the video camera 110. In another embodiment, the balancing signal 464 can be determined from a ratio of first distance information to second distance information, where the first distance information is indicative of estimated, measured, or sensed distance between the electronic apparatus 100 and a subject 150 that is being recorded by the video camera 110, and where the second distance information is indicative of estimated, measured, or sensed distance between the electronic apparatus 100 and an operator 140 of the video camera 110.

In one implementation, the second (operator) distance information can be set as a fixed distance at which an operator of the camera is normally located (e.g., based on an average human holding the device in a predicted usage mode). In such an embodiment, the automated balance controller 480 presumes that the camera operator is a predetermined distance away from the apparatus and generates a balancing signal 464 to reflect that predetermined distance. In essence, this allows a fixed gain to be assigned to the operator because her distance would remain relatively constant, and then front-side gain can be increased or decreased as needed. If the subject audio level would exceed the available level of the audio system, the subject audio level would be set near maximum and the operator audio level would be attenuated.

In another implementation, preset first order beamform values can be assigned to particular values of distance information.

Balance Select Signal

As noted above, in some implementations, the automated balance controller 480 generates a balancing select signal 465 that is processed by the processor 450 along with the input signals 421, 425, 431, 435 to generate the front-side-oriented beamformed audio signal 452 and the rear-side-oriented beamformed audio signal 454. In other words, the balancing select signal 465 can also be used during beamform processing to control an audio level difference between the front-side gain of the front-side-oriented beamformed audio signal 452 and the rear-side gain of the rear-side-oriented beamformed audio signal 454. The balancing select signal 465 may direct the processor 450 to set the audio level difference in a relative manner (e.g., the ratio between the front-side gain and the rear-side gain) or a direct manner (e.g., attenuate the rear-side gain to a given value, or increase the front-side gain to a given value).

In one implementation, the balancing select signal 465 is used to set the audio level difference between the front-side gain and the rear-side gain to a pre-determined value (e.g., X dB difference between the front-side gain and the rear-side gain). In another implementation, the front-side gain and/or the rear-side gain can be set to a pre-determined value during processing based on the balancing select signal 465.

Automatic Gain Control Feedback Signal

The Automatic Gain Control (AGC) module 460 is optional. The AGC module 460 receives the front-side-oriented beamformed audio signal 452 and the rear-side-oriented beamformed audio signal 454, and generates an AGC feedback signal 462 based on signals 452, 454. Depending on the implementation, the AGC feedback signal 462 can be used to adjust or modify the balancing signal 464 itself, or alternatively, can be used in conjunction with the balancing signal 464 and/or the balancing select signal 465 to adjust gain of the front-side-oriented beamformed audio signal 452 and/or the rear-side-oriented beamformed audio signal 454 that is generated by the processor 450.

The AGC feedback signal 462 is used to keep a time averaged ratio of the subject audio level to the operator audio level substantially constant regardless of changes in distance between the subject/operator and the electronic apparatus 100, or changes in the actual audio levels of the subject and operator (e.g., if the subject or operator starts screaming or whispering). In one particular implementation, the time averaged ratio of the subject over the operator increases as the video is zoomed in (e.g., as the value of the zoom control signal changes). In another implementation, the audio level of the rear-side-oriented beamformed audio signal 454 is held at a constant time averaged level independent of the audio level of the front-side-oriented beamformed audio signal 452.

Figure 6:
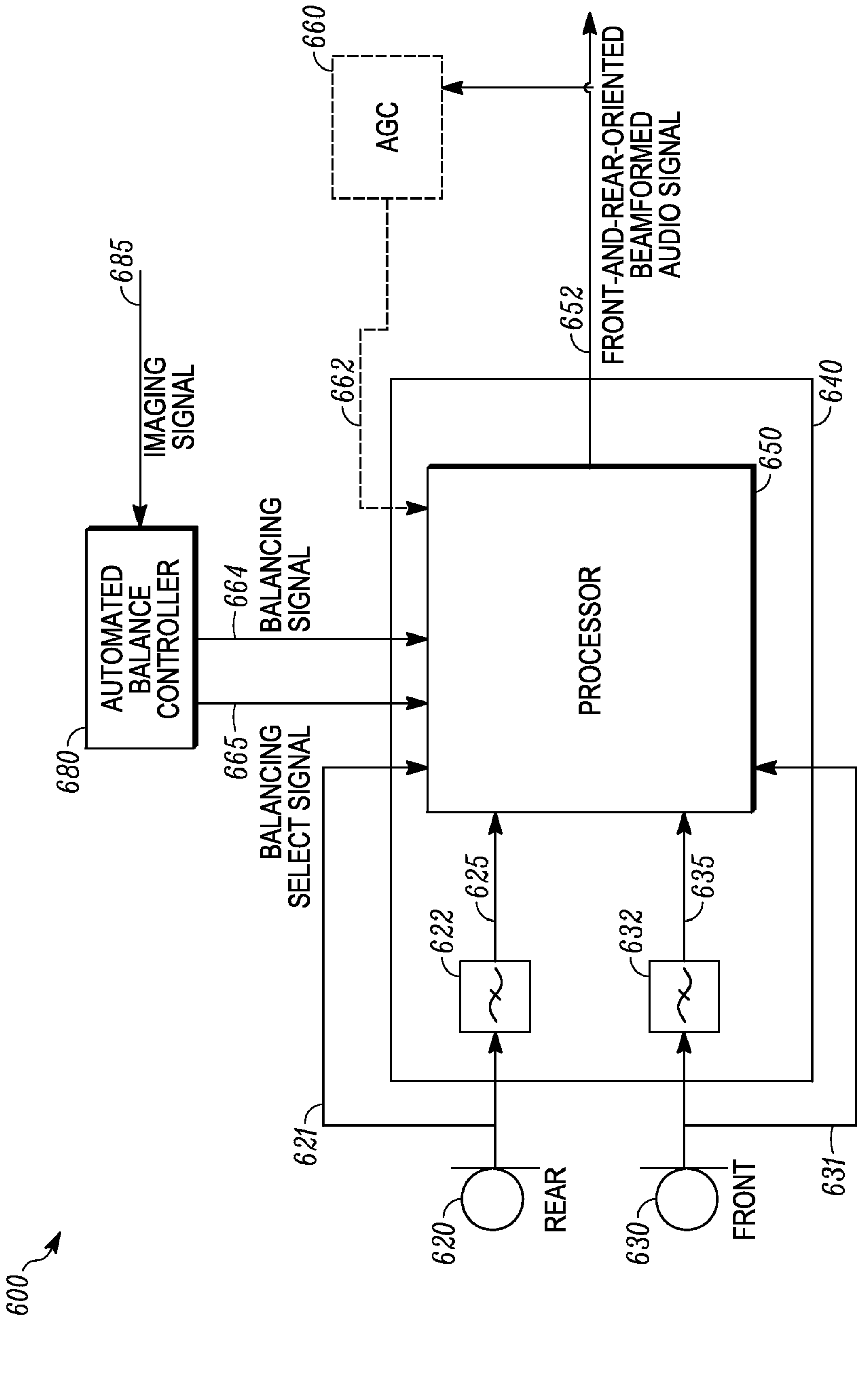
FIG. 6 is a block diagram of an audio processing system of an electronic apparatus in accordance with some of the other disclosed embodiments.

FIG. 6 is a block diagram of an audio processing system 600 of an electronic apparatus 100 in accordance with some of the disclosed embodiments. FIG. 6 is similar to FIG. 4 and so the common features of FIG. 4 will not be described again for sake of brevity. For example: microphones 620, 630 are equivalent to microphones 420, 430; signals 621, 631 are equivalent to signals 421, 431; filtering modules 622, 632 are equivalent to filtering modules 422, 432; phase-delayed audio signals 625, 635 are equivalent to phase-delayed audio signals 425, 435; automatic gain control module 660 is equivalent to AGC module 460; automated balance controller 680 is equivalent to automated balance controller 480; and imaging signal 685 is equivalent to imaging signal 485.

This embodiment differs from FIG. 4 in that the system 600 outputs a single beamformed audio signal 652 that includes the subject and operator audio.

More specifically, in the embodiment illustrated in FIG. 6, the various input signals provided to the processor 650 are processed, based on the balancing signal 664, to generate a single beamformed audio signal 652 in which an audio level difference between a front-side gain of a front-side-oriented lobe 652-A (FIG. 7) and a rear-side gain of a rear-side-oriented lobe 652-B (FIG. 7) of the beamformed audio signal 652 are controlled during processing based on the balancing signal 664 (and possibly based on other signals such as the balancing select signal 665 and/or AGC signal 662). The relative gain of the rear-side-oriented lobe 652-B with respect to the front-side-oriented lobe 652-A can be controlled or adjusted during processing based on the balancing signal 664 to set a ratio between the gains of each lobe. In other words, the maximum gain value of the main lobe 652-A and the maximum gain value of the secondary lobe 652-B form a ratio that that reflects a desired ratio of the subject audio level to the operator audio level. This way, the beamformed audio signal 652 can be controlled to emphasize sound waves emanating from in front of the device with respect to the sound waves emanating from behind the device. In one implementation, the beamform of the beamformed audio signal 652 emphasizes the front-side audio level and/or de-emphasizes the rear-side audio level such that a processed-version of the front-side audio level is at least equal to a processed-version of the rear-side audio level. Any of the balancing signals 664 described above can also be utilized in this embodiment.

Examples of gain control will now be described with reference to FIGS. 7A-7C. The directional patterns shown in FIGS. 7A-7C are a horizontal planar slice through the directional response as would be observed by viewer who located above the electronic apparatus 100 of FIG. 1 who is looking downward, where the z-axis in FIG. 3 corresponds to the 90°-270° line, and the y-axis in FIG. 3 corresponds to the 0°-180° line.

Figure 7A:
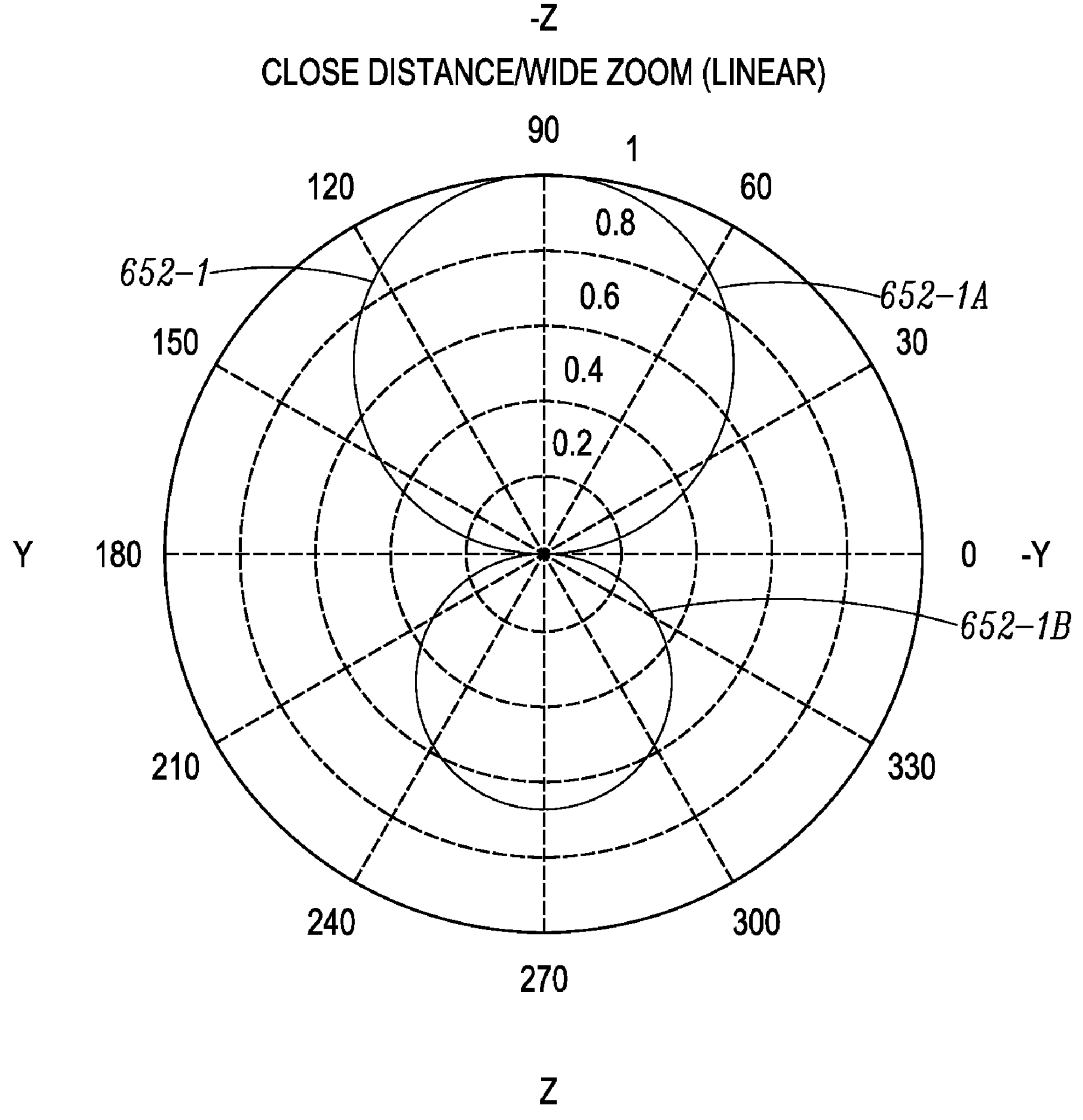
FIG. 7A is an exemplary polar graph of a front-and-rear-side-oriented beamformed audio signal generated by the audio processing system in accordance with one implementation of some of the disclosed embodiments.

FIG. 7A is an exemplary polar graph of a front-and-rear-side-oriented beamformed audio signal 652-1 generated by the audio processing system 600 in accordance with one implementation of some of the disclosed embodiments. As illustrated in FIG. 7A, the front-and-rear-side-oriented beamformed audio signal 652-1 has a first-order directional pattern with a front-side-oriented major lobe 652-1A that is oriented or points towards the subject in the −z-direction or in front of the device, and with a rear-side-oriented minor lobe 652-1B that points or is oriented towards the operator in the +z-direction behind the device, and has a maximum at 270 degrees. This first-order directional pattern has a maximum at 90 degrees and has a relatively strong directional sensitivity to sound originating from the direction of the subject, and a reduced directional sensitivity to sound originating from the direction of the operator. Stated differently, the front-and-rear-side-oriented beamformed audio signal 652-1 emphasizes sound waves emanating from in front of the device.

Figure 7B:
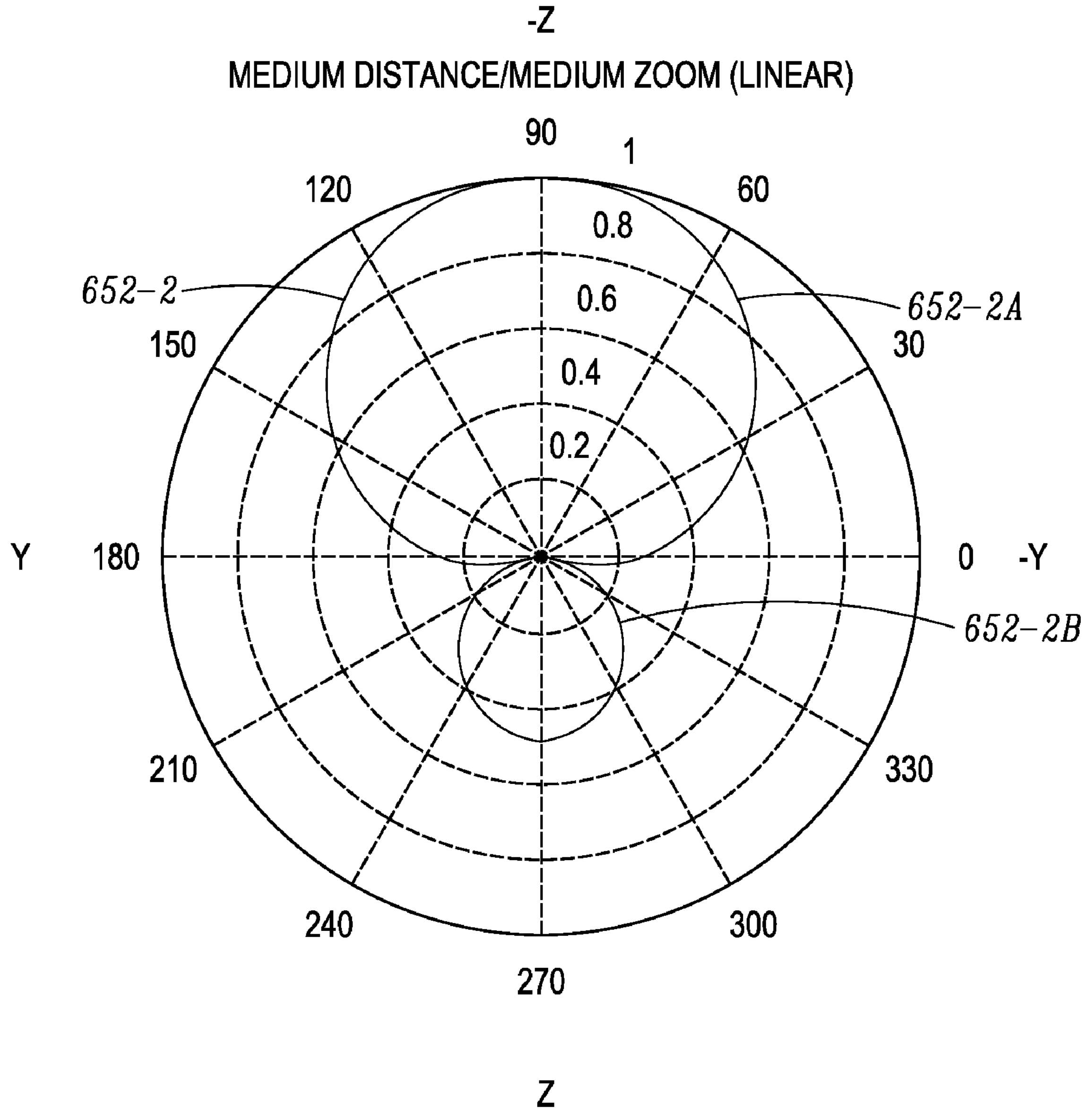
FIG. 7B is an exemplary polar graph of a front-and-rear-side-oriented beamformed audio signal generated by the audio processing system in accordance with another implementation of some of the disclosed embodiments.

FIG. 7B is an exemplary polar graph of a front-and-rear-side-oriented beamformed audio signal 652-2 generated by the audio processing system 600 in accordance with another implementation of some of the disclosed embodiments. In comparison to FIG. 7A, the front-side-oriented major lobe 652-2A that is oriented or points towards the subject has increased in width, and the gain of the rear-side-oriented minor lobe 652-2B that points or is oriented towards the operator has decreased. This indicates that the directional response of the operator's virtual microphone illustrated in FIG. 7B has been attenuated relative to the directional response of the subject's virtual microphone to avoid the operator audio level from overpowering the subject audio level. These settings could be used in a situation where the subject is located at a relatively further distance away from the electronic apparatus 100 than in FIG. 7A as reflected in balancing signal 664.

Figure 7C:
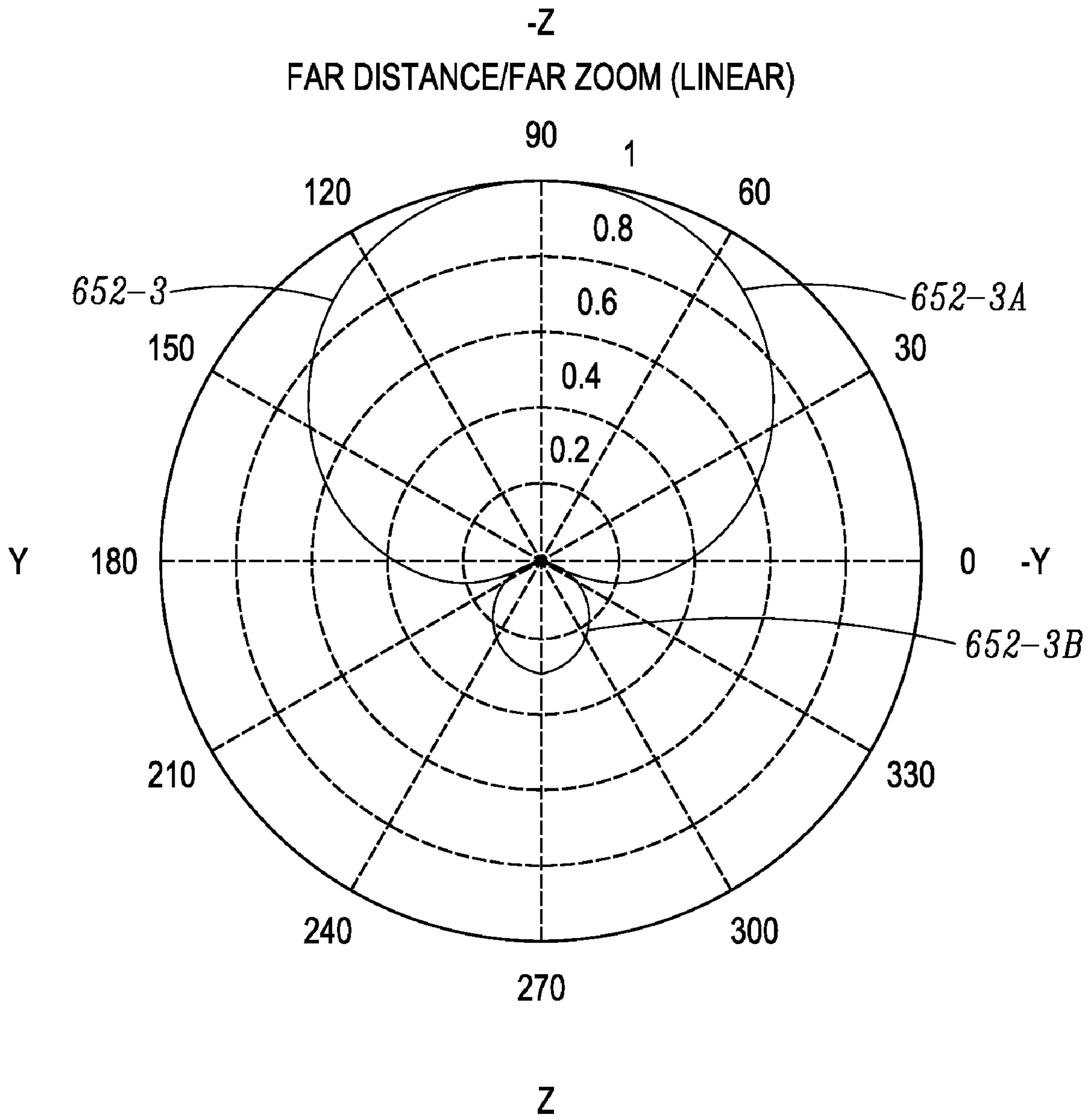
FIG. 7C is an exemplary polar graph of a front-and-rear-side-oriented beamformed audio signal generated by the audio processing system in accordance with yet another implementation of some of the disclosed embodiments.

FIG. 7C is an exemplary polar graph of a front-and-rear-side-oriented beamformed audio signal 652-3 generated by the audio processing system 600 in accordance with yet another implementation of some of the disclosed embodiments. In comparison to FIG. 7B, the front-side-oriented major lobe 652-3A that is oriented or points towards the subject has increased even more in width, and the gain of the rear-side-oriented minor lobe 652-3B oriented towards the operator has decreased even further. This indicates that the directional response of the operator's virtual microphone illustrated in FIG. 7C has been attenuated even more relative to the directional response of the subject's virtual microphone to avoid the operator audio level from overpowering the subject audio level. These settings could be used in a situation where the subject is located at a relatively further distance away from the electronic apparatus 100 than in FIG. 7B as reflected in balancing signal 664.

The examples illustrated in FIGS. 7A-7C show that the beamform responses of the front-and-rear-side-oriented beamformed audio signal 652 as the subject gets farther away from the apparatus 100 as reflected in balancing signal 664. As the subject gets further away, the front-side-oriented major lobe 652-1A increases relative to the rear-side-oriented minor lobe 652-1B, and the width of the front-side-oriented major lobe 652-1A increases as the relative gain difference between the front-side-oriented major lobe 652-1A and rear-side-oriented minor lobe 652-1B increases.

In addition, FIGS. 7A-7C also generally illustrate that the relative gain of the front-side-oriented major lobe 652-1A with respect to the rear-side-oriented minor lobe 652-1B can be controlled or adjusted during processing based on the balancing signal 664. This way the ratio of gains of the front-side-oriented major lobe 652-1A with respect to the rear-side-oriented minor lobe 652-1B can be controlled so that one does not dominate the other.

As above, in one implementation, the relative gain of the front-side-oriented major lobe 652-1A can be increased with respect to the rear-side-oriented minor lobe 652-1B so that the audio level corresponding to the operator is less than or equal to the audio level corresponding to the subject (e.g., a ratio of subject audio level to operator audio level is greater than or equal to one). This way the audio level of the operator will not overpower that of the subject.

Although the beamformed audio signal 652 shown in FIG. 7A through 7C is beamformed with a first order directional beamform pattern, those skilled in the art will appreciate that the beamformed audio signal 652 is not necessarily limited to a first order directional patterns and that they are shown to illustrate one exemplary implementation. Furthermore, the first order directional beamform pattern shown here has nulls to the sides and a directivity index between that of a bidirectional and cardioid, but the first order directional beamform could have the same front-back gain ratio and have a directivity index between that of a cardioid and an omnidirectional beamform pattern resulting in no nulls to the sides. Moreover, although the beamformed audio signal 652 is illustrated as having a mathematically ideal directional pattern, it will be appreciated by those skilled in the art, that these are examples only and that, in practical implementations, these idealized beamform patterns will not necessarily be achieved.

Figure 8:
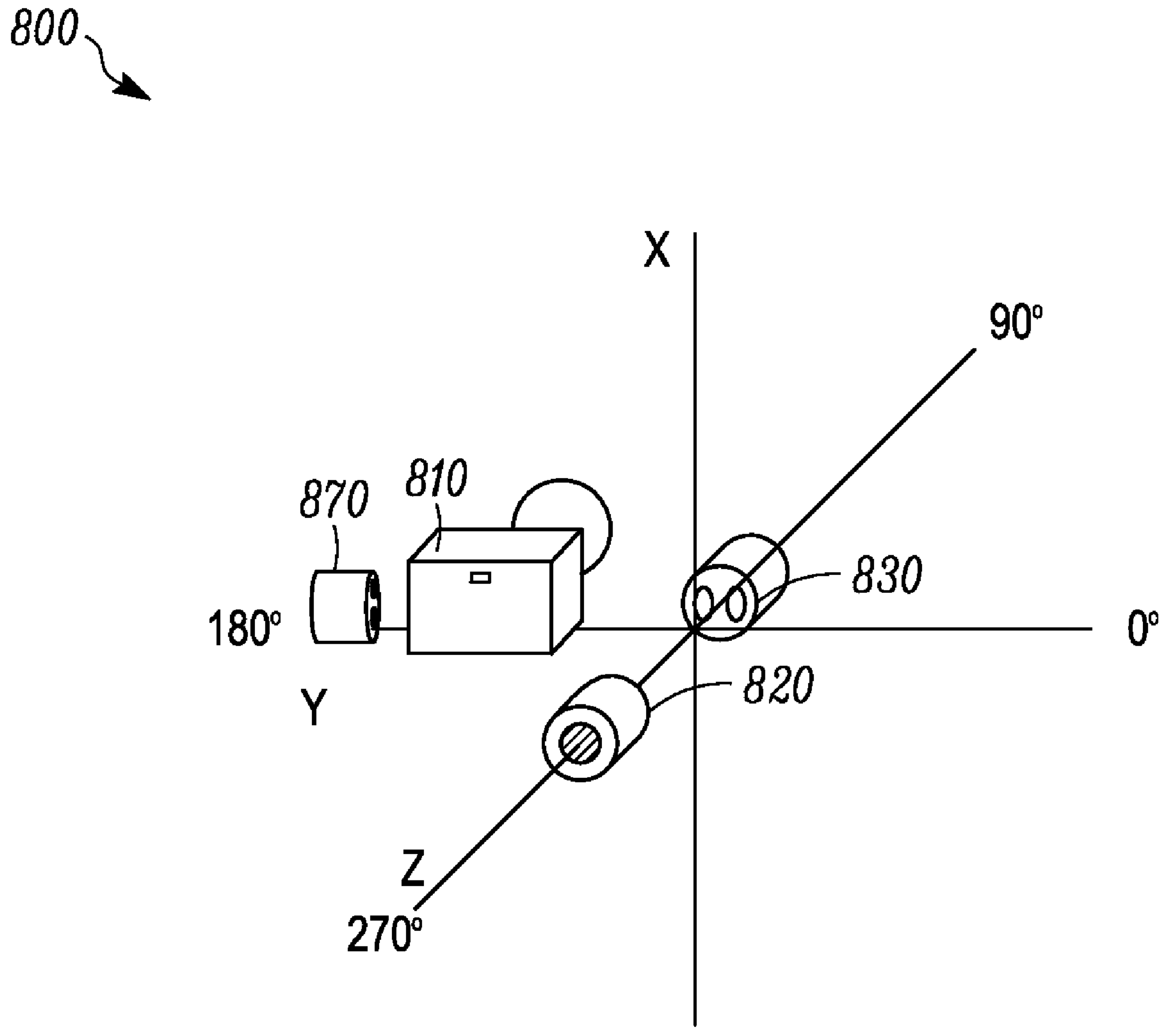
FIG. 8 is a schematic of a microphone and video camera configuration of the electronic apparatus in accordance with some of the other disclosed embodiments.

FIG. 8 is a schematic of a microphone and video camera configuration 800 of the electronic apparatus in accordance with some of the other disclosed embodiments. As with FIG. 3, the configuration 800 is illustrated with reference to a Cartesian coordinate system. In FIG. 8, the relative locations of a rear-side microphone 820, a front-side microphone 830, a third microphone 870, and front-side video camera 810 are shown. The microphones 820, 830 are located or oriented along a common z-axis and separated by 180 degrees along a line at 90 degrees and 270 degrees. The first physical microphone element 820 is on an operator or rear-side of portable electronic apparatus 100, and the second physical microphone element 830 is on the subject or front-side of the electronic apparatus 100. The third microphone 870 is located along the y-axis is oriented along a line at approximately 180 degrees, and the x-axis is oriented perpendicular to the y-axis and the z-axis in an upward direction. The video camera 810 is also located along the y-axis and points into the page in the −z-direction towards the subject in front of the device as does the microphone 830. The subject (not shown) would be located in front of the front-side microphone 830, and the operator (not shown) would be located behind the rear-side microphone 820. This way the microphones are oriented such that they can capture audio signals or sound from the operator taking the video and as well as from a subject being recorded by the video camera 810.

As in FIG. 3, the physical microphones 820, 830, 870 described herein can be any known type of physical microphone elements including omni-directional microphones, directional microphones, pressure microphones, pressure gradient microphones, etc. The physical microphones 820, 830, 870 can be part of a microphone array that is processed using beamforming techniques such as delaying and summing (or delaying and differencing) to establish directional patterns based on outputs generated by the physical microphones 820, 830, 870.

As will now be described with reference to FIGS. 9-10D, the rear-side gain of a virtual microphone element corresponding to the operator can be controlled and attenuated relative to left and right front-side gains of virtual microphone elements corresponding to the subject so that the operator audio level does not overpower the subject audio level. In addition, since the three microphones allow for directional patterns to be created at any angle in the yz-plane, the left and right front-side virtual microphone elements along with the rear-side virtual microphone elements can allow for stereo or surround recordings of the subject to be created while simultaneously allowing operator narration to be recorded.

Figure 9:
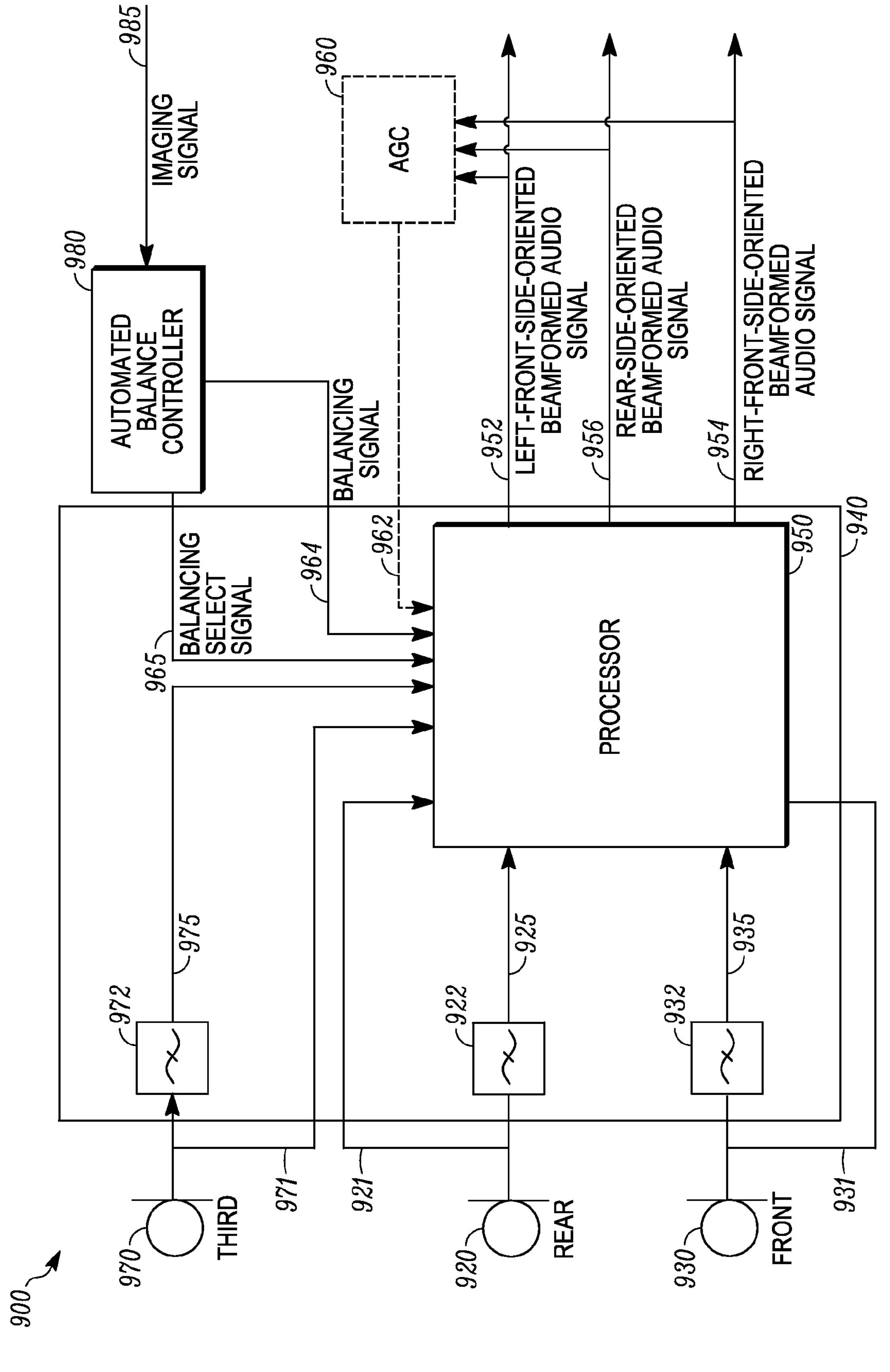
FIG. 9 is a block diagram of an audio processing system of an electronic apparatus in accordance with some of the other disclosed embodiments.

FIG. 9 is a block diagram of an audio processing system 900 of an electronic apparatus 100 in accordance with some of the disclosed embodiments.

The audio processing system 900 includes a microphone array that includes a first microphone 920 that generates a first signal 921 in response to incoming sound, a second microphone 930 that generates a second signal 931 in response to the incoming sound, and a third microphone 970 that generates a third signal 971 in response to the incoming sound. These output signals are generally an electrical (e.g., voltage) signals that correspond to a sound pressure captured at the microphones.

A first filtering module 922 is designed to filter the first signal 921 to generate a first phase-delayed audio signal 925 (e.g., a phase delayed version of the first signal 921), a second filtering module 932 designed to filter the second electrical signal 931 to generate a second phase-delayed audio signal 935, and a third filtering module 972 designed to filter the third electrical signal 971 to generate a third phase-delayed audio signal 975. As noted above with reference to FIG. 4, although the first filtering module 922, the second filtering module 932 and the third filtering module 972 are illustrated as being separate from processor 950, it is noted that in other implementations the first filtering module 922, the second filtering module 932 and the third filtering module 972 can be implemented within the processor 950 as indicated by the dashed-line rectangle 940.

The automated balance controller 980 generates a balancing signal 964 based on an imaging signal 985 using any of the techniques described above with reference to FIG. 4. As such, depending on the implementation, the imaging signal 985 can be provided from any one of number of different sources, as will be described in greater detail above. In one implementation, the video camera 810 is coupled to the automated balance controller 980.

Figure 10A:
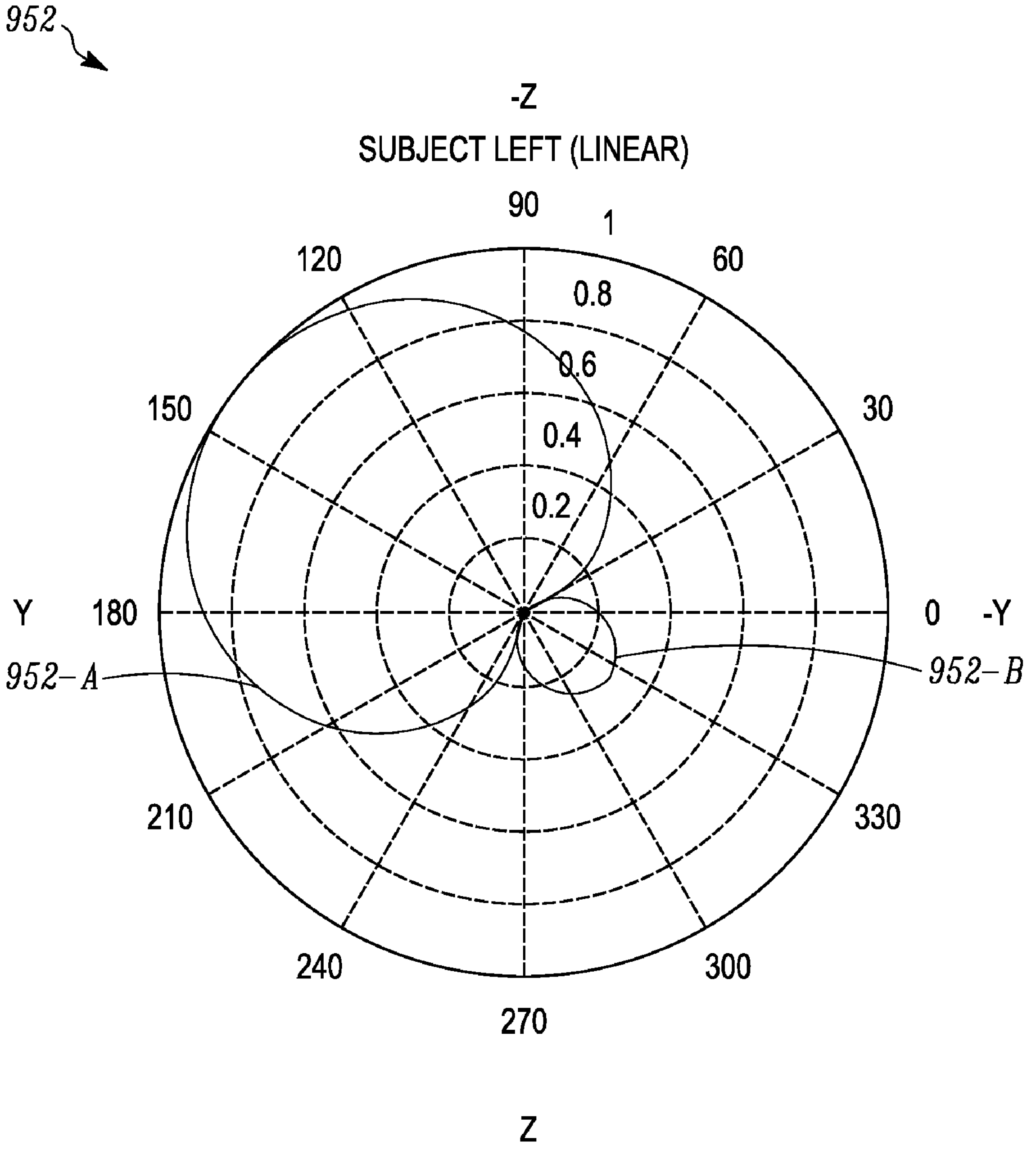
FIG. 10A is an exemplary polar graph of a left-front-side-oriented beamformed audio signal generated by the audio processing system in accordance with one implementation of some of the disclosed embodiments.
Figure 10B:
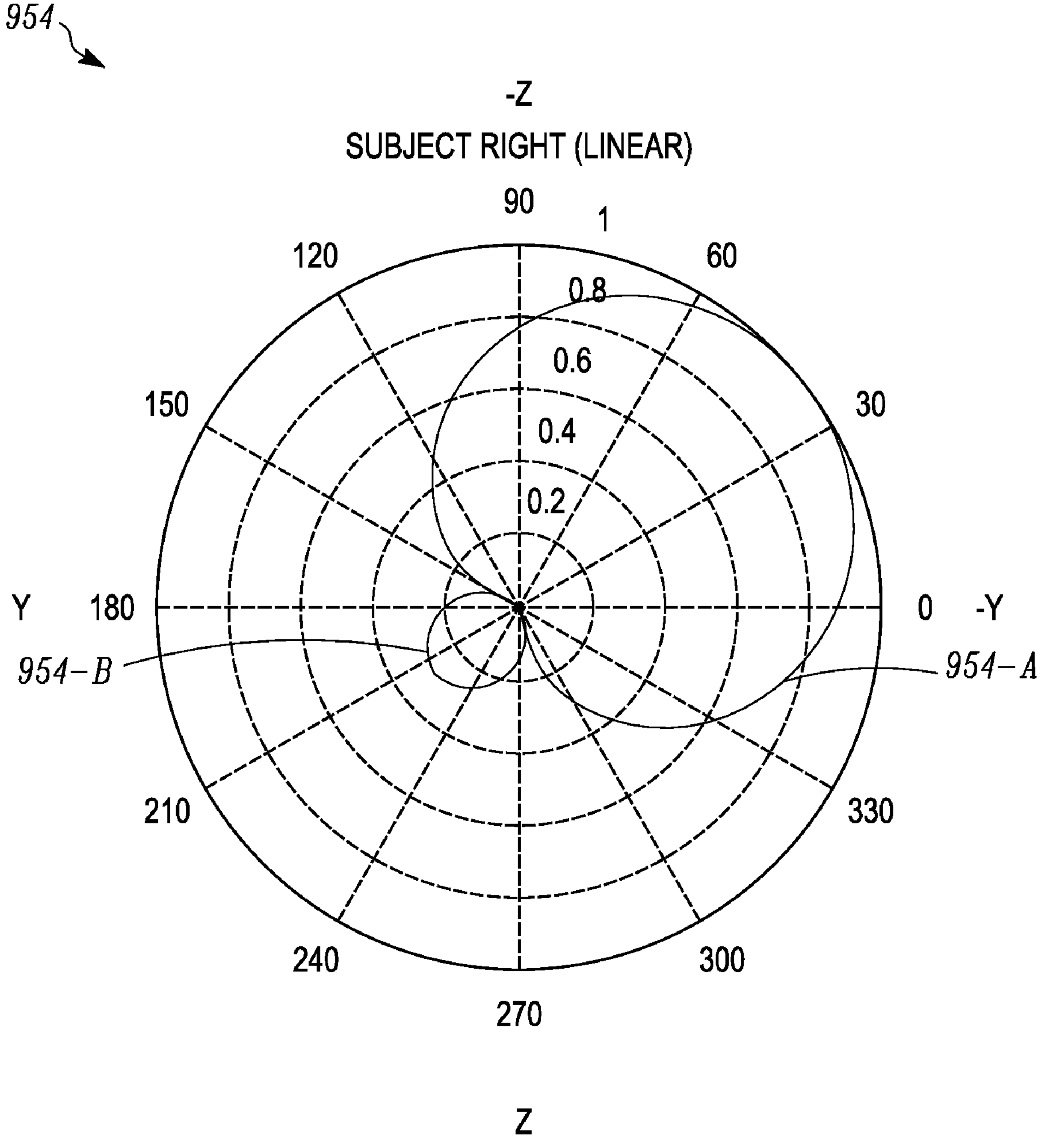
FIG. 10B is an exemplary polar graph of a right-front-side-oriented beamformed audio signal generated by the audio processing system in accordance with one implementation of some of the other disclosed embodiments.

The processor 950 receives a plurality of input signals including the first signal 921, the first phase-delayed audio signal 925, the second signal 931, the second phase-delayed audio signal 935, the third signal 971, and the third phase-delayed audio signal 975. The processor 950 processes these input signals 921, 925, 931, 935, 971, 975 based on the balancing signal 964 (and possibly based on other signals such as the balancing select signal 965 or AGC signal 962), to generate a left-front-side-oriented beamformed audio signal 952, a right-front-side-oriented beamformed audio signal 954, and a rear-side-oriented beamformed audio signal 956 that correspond to a left "subject" channel, a right "subject" channel and a rear "operator" channel, respectively. As will be described below, the balancing signal 964 can be used to control an audio level difference between a left front-side gain of the front-side-oriented beamformed audio signal 952, a right front-side gain of the right-front-side-oriented beamformed audio signal 954, and a rear-side gain of the rear-side-oriented beamformed audio signal 956 during beamform processing. This allows for control of the audio levels of the subject virtual microphones with respect to the operator virtual microphone. The beamform processing performed by the processor 950 can be performed using any known beamform processing technique for generating directional patterns based on microphone input signals. FIGS. 10A-B provide examples where the main lobes are no longer oriented at 90 degrees but at symmetric angles about 90 degrees. Of course, the main lobes could be steered to other angles based on standard beamforming techniques. In this example, the null from each virtual microphone is centered at 270 degrees to suppress signal coming from the operator at the back of the device.

In one implementation, the balancing signal 964 can be used to determine a ratio of a first gain of the rear-side-oriented beamformed audio signal 956 with respect to a second gain of the main lobe 952-A (FIG. 10) of the left-front-side-oriented beamformed audio signal 952, and a third gain of the main lobe 954-A (FIG. 10) of the right-front-side-oriented beamformed audio signal 954. In other words, the balancing signal 964 will determine the relative weighting of the first gain with respect to the second gain and third gain such that sound waves emanating from the left-front-side and right-front-side are emphasized with respect to other sound waves emanating from the rear-side. The relative gain of the rear-side-oriented beamformed audio signal 956 with respect to the left-front-side-oriented beamformed audio signal 952 and the right-front-side-oriented beamformed audio signal 954 can be controlled during processing based on the balancing signal 964. To do so, in one implementation, the first gain of the rear-side-oriented beamformed audio signal 956 and/or the second gain of the left-front-side-oriented beamformed audio signal 952, and/or the third gain of the right-front-side-oriented beamformed audio signal 954 can be varied. For instance, in one implementation, the rear gain and front gains are adjusted so that they are substantially balanced so that the operator audio will not dominate over the subject audio.

In one implementation, the processor 950 can include a look up table (LUT) that receives the input signals 921, 925, 931, 935, 971, 975 and the balancing signal 964, and generates the left-front-side-oriented beamformed audio signal 952, the right-front-side-oriented beamformed audio signal 954, and the rear-side-oriented beamformed audio signal 956. In another implementation, the processor 950 is designed to process an equation based on the input signals 921, 925, 931, 935, 971, 975 and the balancing signal 964 to generate the left-front-side-oriented beamformed audio signal 952, the right-front-side-oriented beamformed audio signal 954, and the rear-side-oriented beamformed audio signal 956. The equation includes coefficients for the first signal 921, the first phase-delayed audio signal 925, the second signal 931, the second phase-delayed audio signal 935, the third signal 971, and the third phase-delayed audio signal 975, and the values of these coefficients can be adjusted or controlled based on the balancing signal 964 to generate a gain-adjusted left-front-side-oriented beamformed audio signal 952, a gain-adjusted right-front-side-oriented beamformed audio signal 954, and/or a gain adjusted the rear-side-oriented beamformed audio signal 956.

Examples of gain control will now be described with reference to FIGS. 10A-10D. Similar to the other example graphs above, the directional patterns shown in FIGS. 10A-10D are a horizontal planar representation of the directional response as would be observed by viewer who located above the electronic apparatus 100 of FIG. 1 who is looking downward, where the z-axis in FIG. 8 corresponds to the 90°-270° line, and the y-axis in FIG. 8 corresponds to the 0°-180° line.

FIG. 10A is an exemplary polar graph of a left-front-side-oriented beamformed audio signal 952 generated by the audio processing system 900 in accordance with one implementation of some of the disclosed embodiments. As illustrated in FIG. 10A, the left-front-side-oriented beamformed audio signal 952 has a first-order directional pattern that is oriented or points towards the subject at an angle in front of the device between the +y-direction and the −z-direction. In this particular example, the left-front-side-oriented beamformed audio signal 952 has a first major lobe 952-A and a first minor lobe 952-B. The first major lobe 952-A is oriented to the left of the subject being recorded and has a left-front-side gain. This first-order directional pattern has a maximum at approximately 150 degrees and has a relatively strong directional sensitivity to sound originating from a direction to the left of the subject towards the apparatus 100. The left-front-side-oriented beamformed audio signal 952 also has a null at 270 degrees that points towards the operator (in the +z-direction) who is recording the subject, which indicates that there is reduced directional sensitivity to sound originating from the direction of the operator. The left-front-side-oriented beamformed audio signal 952 also has a null to the right at 90 degrees that points or is oriented towards the right-side of the subject being recorded, which indicates that there is reduced directional sensitivity to sound originating from the direction to the right-side of the subject. Stated differently, the left-front-side-oriented beamformed audio signal 952 emphasizes sound waves emanating from the front-left and includes a null oriented towards the rear housing and the operator.

FIG. 10B is an exemplary polar graph of a right-front-side-oriented beamformed audio signal 954 generated by the audio processing system 900 in accordance with one implementation of some of the disclosed embodiments. As illustrated in FIG. 10B, the right-front-side-oriented beamformed audio signal 954 has a first-order directional pattern that is oriented or points towards the subject at an angle in front of the device between the −y-direction and the −z-direction. In this particular example, the right-front-side-oriented beamformed audio signal 954 has a second major lobe 954-A and a second minor lobe 954-B. The second major lobe 954-A has a right-front-side gain. In particular, this first-order directional pattern has a maximum at approximately 30 degrees and has a relatively strong directional sensitivity to sound originating from a direction to the right of the subject towards the apparatus 100. The right-front-side-oriented beamformed audio signal 954 also has a null at 270 degrees that points towards the operator (in the +z-direction) who is recording the subject, which indicates that there is reduced directional sensitivity to sound originating from the direction of the operator. The right-front-side-oriented beamformed audio signal 954 also has a null to the left of 90 degrees that is oriented towards the left-side of the subject being recorded, which indicates that there is reduced directional sensitivity to sound originating from the direction to the left-side of the subject. Stated differently, the right-front-side-oriented beamformed audio signal 954 emphasizes sound waves emanating from the front-right and includes a null oriented towards the rear housing and the operator. It will be appreciated by those skilled in the art, that these are examples only and that angle of the maximum of the main lobes can change based on the angular width of the video frame, however nulls remaining at 270 degrees help to cancel the sound emanating from the operator behind the device.

Figure 10C:
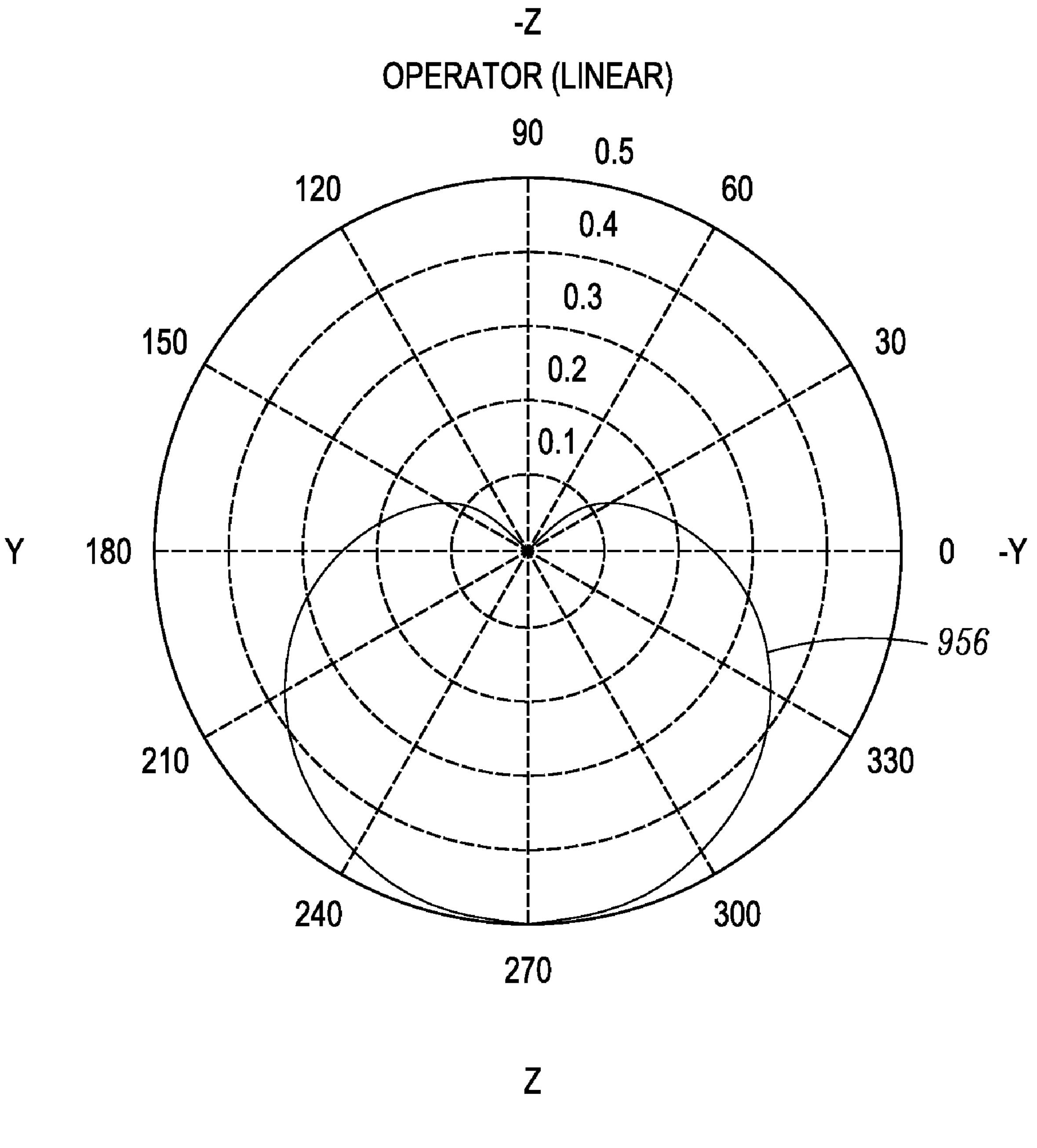
FIG. 10C is an exemplary polar graph of a rear-side-oriented beamformed audio signal generated by the audio processing system in accordance with one implementation of some of the other disclosed embodiments.

FIG. 10C is an exemplary polar graph of a rear-side-oriented beamformed audio signal 956 generated by the audio processing system 900 in accordance with one implementation of some of the disclosed embodiments. As illustrated in FIG. 10C, the rear-side-oriented beamformed audio signal 956 has a first-order cardioid directional pattern that points or is oriented behind the apparatus 100 towards the operator in the +z-direction, and has a maximum at 270 degrees. The rear-side-oriented beamformed audio signal 956 has a rear-side gain, and relatively strong directional sensitivity to sound originating from the direction of the operator. The rear-side-oriented beamformed audio signal 956 also has a null (at 90 degrees) that points towards the subject (in the −z-direction), which indicates that there is little or no directional sensitivity to sound originating from the direction of the subject. Stated differently, the rear-side-oriented beamformed audio signal 956 emphasizes sound waves emanating from the rear of the housing and has a null oriented towards the front of the housing.

Although not illustrated in FIG. 9, in some embodiments, the beamformed audio signals 952, 954, 956 can be combined into a single output signal that can be transmitted and/or recorded. Alternately, the output signal could be a two-channel stereo signal or a multi-channel surround signal.

Figure 10D:
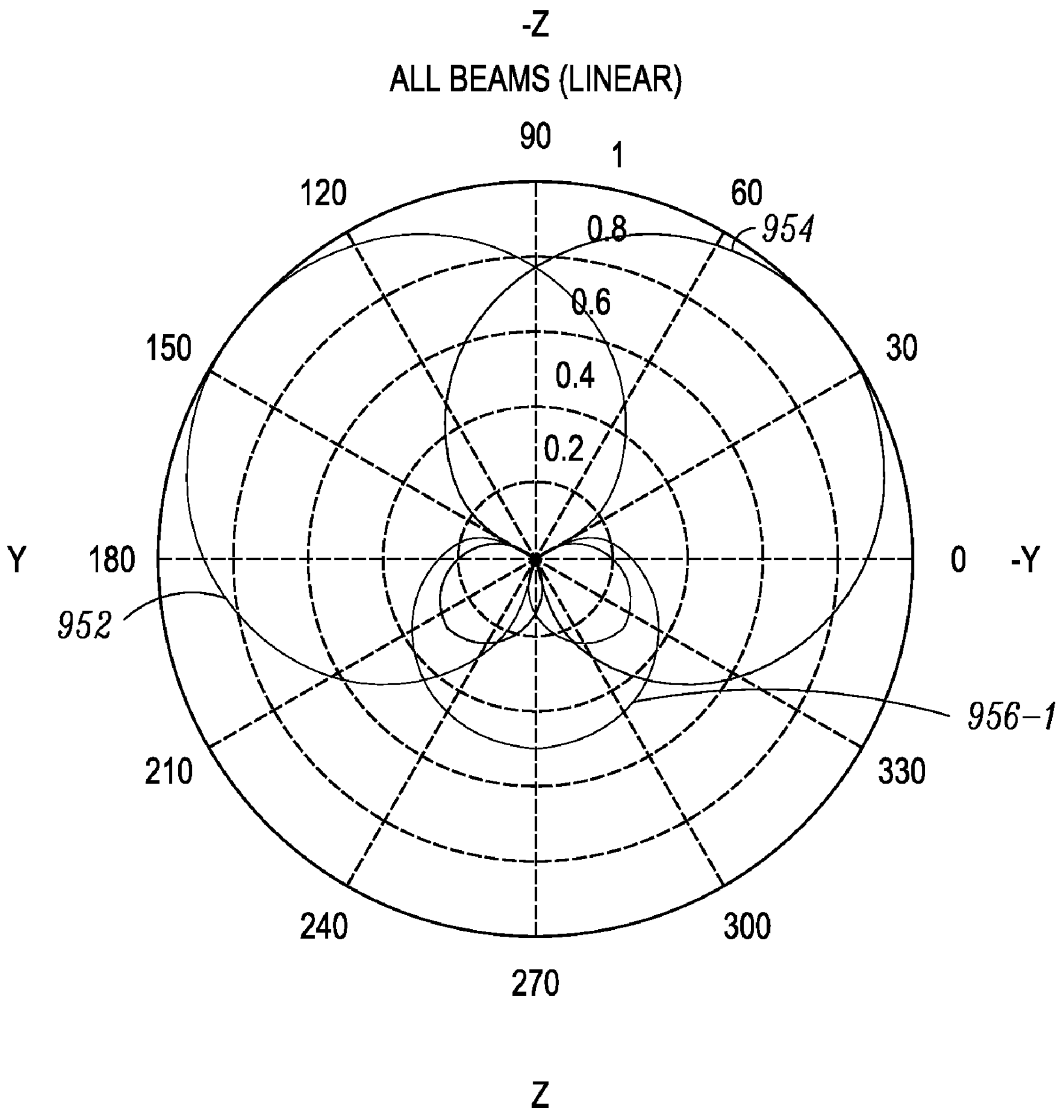
FIG. 10D is an exemplary polar graph of the front-side-oriented beamformed audio signal, the right-front-side-oriented beamformed audio signal, and the rear-side-oriented beamformed audio signal generated by the audio processing system when combined to generate a stereo-surround output in accordance with one implementation of some of the disclosed embodiments.

FIG. 10D is an exemplary polar graph of the left-front-side-oriented beamformed audio signal 952, the right-front-side-oriented beamformed audio signal 954 and the rear-side-oriented beamformed audio signal 956-1 when combined to generate a multi-channel surround signal output. Although the responses of the left-front-side-oriented beamformed audio signal 952, the right-front-side-oriented beamformed audio signal 954, and the rear-side-oriented beamformed audio signal 956-1 are shown together in FIG. 10D, it is noted that this not intended to necessarily imply that the beamformed audio signals 952, 954, 956-1 have to be combined in all implementations. In comparison to FIG. 10C, the gain of the rear-side-oriented beamformed audio signal 956-1 has decreased.

As illustrated in FIG. 10D, the directional response of the operator's virtual microphone illustrated in FIG. 10C can been attenuated relative to the directional response of the subject's virtual microphones to avoid the operator audio level from overpowering the subject audio level. The relative gain of the rear-side-oriented beamformed audio signal 956-1 with respect to the front-side-oriented beamformed audio signals 952, 954 can be controlled or adjusted during processing based on the balancing signal 964 to account for the subject's and/or the operator's distance away from the electronic apparatus 100. In one implementation, the audio level difference between the right-front-side gain, the left-front-side gain, and the rear-side gain is controlled during processing based on the balancing signal 964. By varying the gains of the virtual microphones based on the balancing signal 964, the ratio of gains of the beamformed audio signals 952, 954, 956 can be controlled so that one does not dominate the other.

In each of the left-front-side-oriented beamformed audio signal 952 and the right-front-side-oriented beamformed audio signal 954, a null can be focused on the rear-side (or operator) to cancel operator audio. For a stereo output implementation, the rear-side-oriented beamformed audio signal 956, which is oriented towards the operator, can be mixed in with each output channel (corresponding to the left-front-side-oriented beamformed audio signal 952 and the right-front-side-oriented beamformed audio signal 954) to capture the operator's narration.

Although the beamformed audio signals 952, 954 shown in FIGS. 10A and 10B have a particular first order directional pattern, and although the beamformed audio signal 956 is beamformed according to a rear-side-oriented cardioid directional beamform pattern, those skilled in the art will appreciate that the beamformed audio signals 952, 954, 956 are not necessarily limited to having the particular types of first order directional patterns illustrated in FIGS. 10A-10D, and that these are shown to illustrate one exemplary implementation. The directional patterns can generally have any first order directional beamform patterns such as cardioid, dipole, hypercardioid, supercardioid, etc. Alternately, higher order directional beamform patterns may be used. Moreover, although the beamformed audio signals 952, 954, 956 are illustrated as having mathematically ideal first order directional patterns, it will be appreciated by those skilled in the art, that these are examples only and that, in practical implementations, these idealized beamform patterns will not necessarily be achieved.

Figure 11:
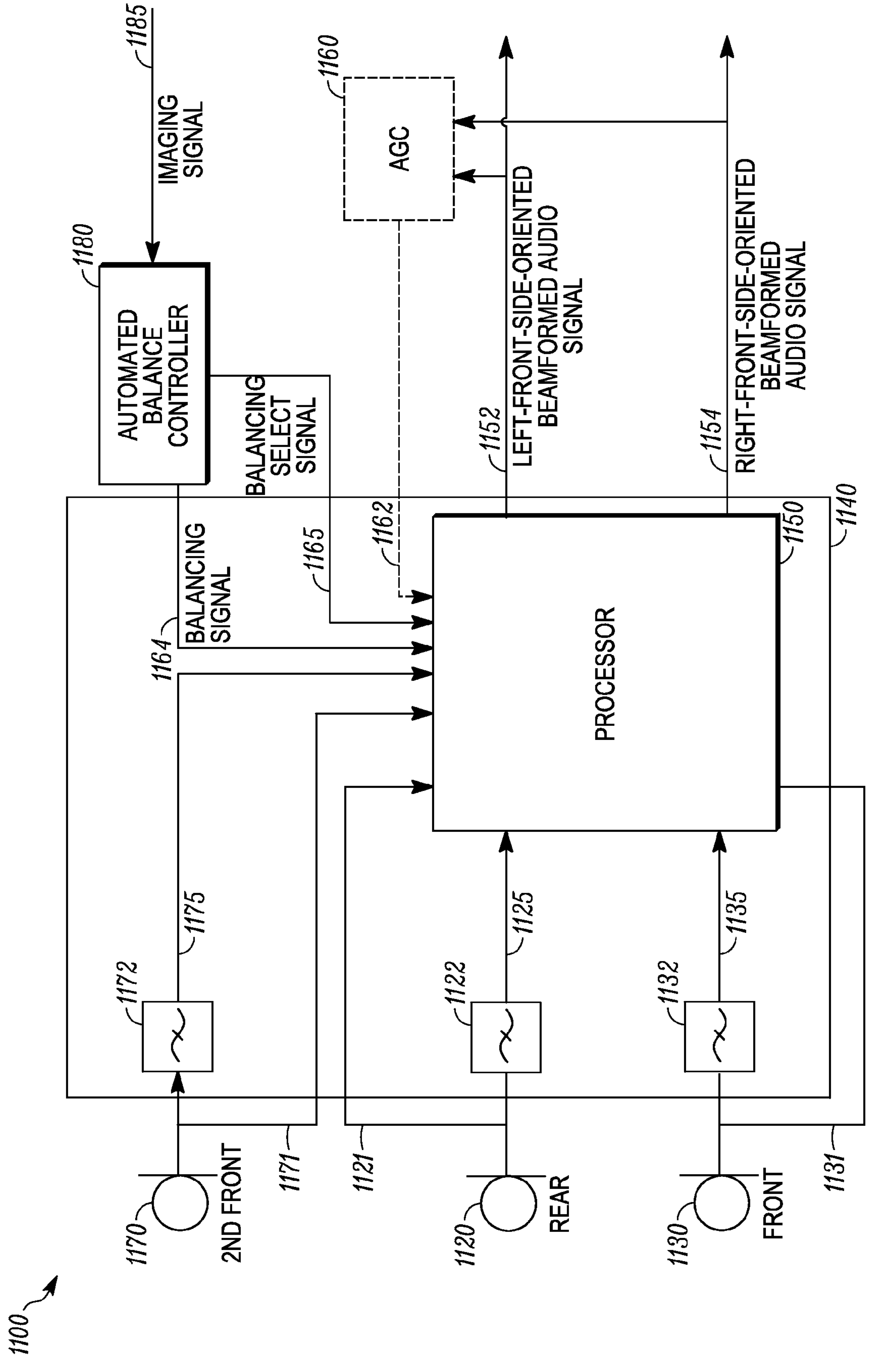
FIG. 11 is a block diagram of an audio processing system of an electronic apparatus in accordance with some other disclosed embodiments.

FIG. 11 is a block diagram of an audio processing system 1100 of an electronic apparatus 100 in accordance with some of the disclosed embodiments. The audio processing system 1100 of FIG. 11 is nearly identical to that in FIG. 9 except that instead of generating three beamformed audio signals, only two beamformed audio signals are generated. The common features of FIG. 9 will not be described again for sake of brevity. For example: microphones 1120, 1130, 1170 are similar to microphones 920, 930, 970; filtering modules 1122, 1132, 1172 are equivalent to filtering modules 922, 932, 972; automatic gain control module 1160 is equivalent to AGC module 960; automated balance controller 1180 is equivalent to automated balance controller 980; and imaging signal 1185 is equivalent to imaging signal 985.

More specifically, the processor 1150 processes input signals 1121, 1125, 1131, 1135, 1171, 1175 based on the balancing signal 1164 (and possibly based on other signals such as the balancing select signal 1165 or AGC signal 1162), to generate a left-front-side-oriented beamformed audio signal 1152 and a right-front-side-oriented beamformed audio signal 1154 without generating a separate rear-side-oriented beamformed audio signal (as in FIG. 9). This eliminates the need to sum/mix the left-front-side-oriented beamformed audio signal 1152 with a separate rear-side-oriented beamformed audio signal, and the need to sum/mix the right-front-side-oriented beamformed audio signal 1154 with a separate rear-side-oriented beamformed audio signal. The directional patterns of the left and right front-side virtual microphone elements that correspond to the signals 1152, 1154 can be created at any angle in the yz-plane to allow for stereo recordings of the subject to be created while still allowing for operator narration to be recorded. For example, instead of creating and mixing a separate operator beamform with each subject channel, the left-front-side-oriented beamformed audio signal 1152 and the right-front-side-oriented beamformed audio signal 1154 each capture half of the desired audio level of the operator, and when listened to in stereo playback would result in an appropriate audio level representation of the operator with a central image.

In this embodiment, the left-front-side-oriented beamformed audio signal 1152 (FIG. 12A) has a first major lobe 1152-A having a left-front-side gain and a first minor lobe 1152-B having a rear-side gain at 270 degrees, and the right-front-side-oriented beamformed audio signal 1154 (FIG. 12B) has a second major lobe 1154-A having a right-front-side gain and a second minor lobe 1154-B having a rear-side gain at 270 degrees. The reason that the gain comparison is now done at the major lobes and at 270 degrees is that the 270 degree point relates to the operator position. Because we are primarily interested in the balance between the front subject signals and the rear operator signal, we look at the main lobes and the location of the operator (which is presumed to be at 270 degrees). In this case unlike in that of FIG. 9, a null will not exist at 270 degrees.

As will be described below, the balancing signal 1164 can be used during beamform processing to control an audio level difference between the left-front-side gain of the first major lobe and the rear-side gain of the first minor lobe at 270 degrees, and to control an audio level difference between the right-front-side gain of the second major lobe and the rear-side gain of the second minor lobe at 270 degrees. This way, the front-side gain and rear-side gain of each virtual microphone elements can be controlled and attenuated relative to one another.

A portion of the left-front-side beamformed audio signal 1152 attributable to the first minor lobe 1152-B and a portion of the right-front-side beamformed audio signal 1154 attributable to the second minor lobe 1154-B will be perceptually summed by the user through normal listening. This allows for control of the audio levels of the subject virtual microphones with respect to the operator virtual microphone. The beamform processing performed by the processor 1150 can be performed using any known beamform processing technique for generating directional patterns based on microphone input signals. Any of the techniques described above for controlling the audio level differences can be adapted for use in this embodiment. In one implementation, the balancing signal 1164 can be used to control a ratio or relative weighting of the front-side gain and rear-side gain at 270 degrees for a particular one of the signals 1152, 1154, and for sake of brevity those techniques will not be described again.

Examples of gain control will now be described with reference to FIGS. 12A-12C. Similar to the other example graphs above, the directional patterns shown in FIGS. 12A-12C are planar representations that would be observed by a viewer located above the electronic apparatus 100 of FIG. 1 who is looking downward, where the z-axis in FIG. 8 corresponds to the 90°-270° line, and the y-axis in FIG. 8 corresponds to the 0°-180° line.

Figure 12A:
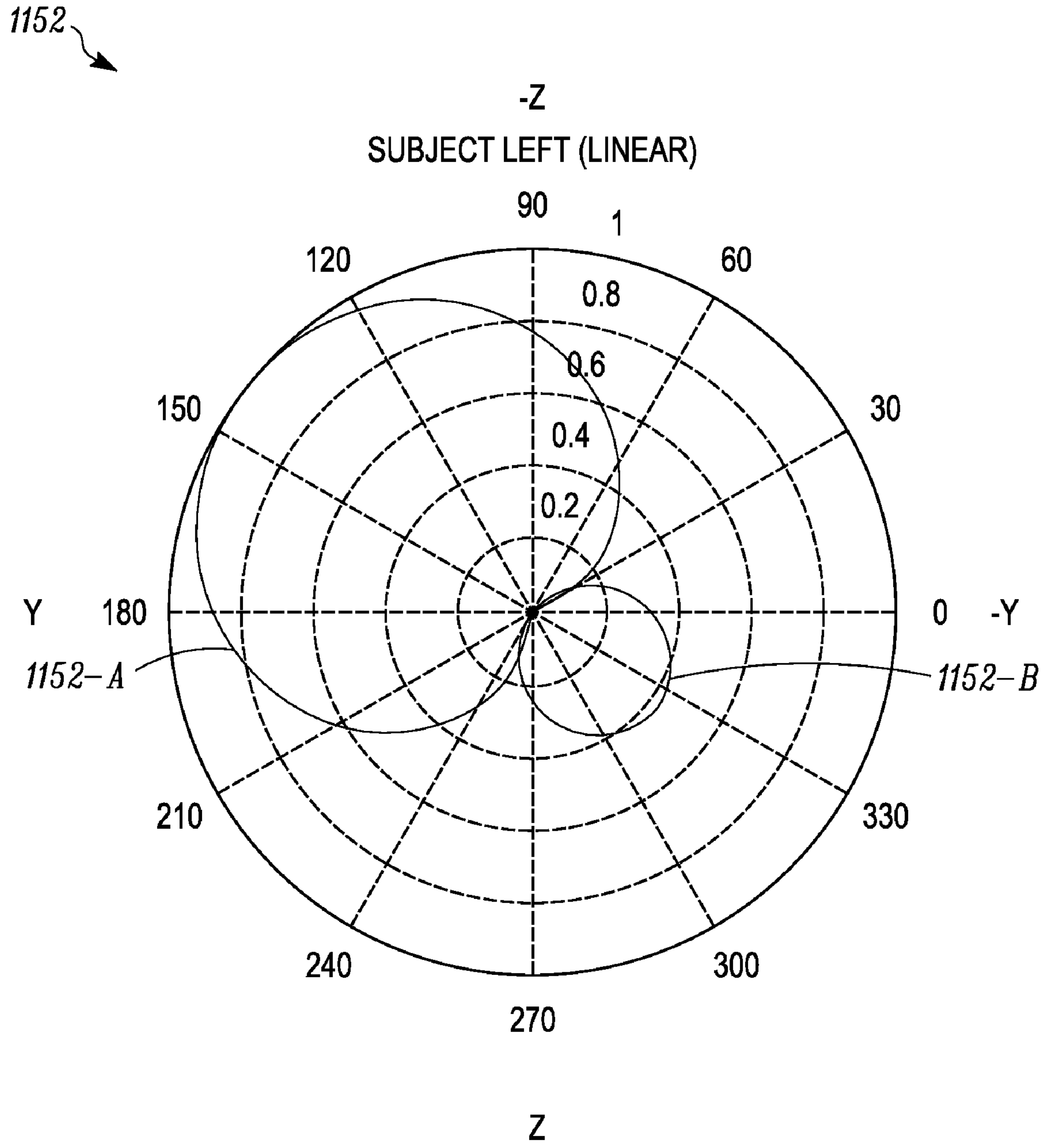
FIG. 12A is an exemplary polar graph of a left-front-side-oriented beamformed audio signal generated by the audio processing system in accordance with one implementation of some of the disclosed embodiments.

FIG. 12A is an exemplary polar graph of a left-front-side-oriented beamformed audio signal 1152 generated by the audio processing system 1100 in accordance with one implementation of some of the disclosed embodiments.

As illustrated in FIG. 12A, the left-front-side-oriented beamformed audio signal 1152 has a first-order directional pattern that is oriented or points towards the subject at an angle in front of the device between the y-direction and the −z-direction. In this particular example, the left-front-side-oriented beamformed audio signal 1152 has a major lobe 1152-A and a minor lobe 1152-B. The major lobe 1152-A is oriented to the left of the subject being recorded and has a left-front-side gain, whereas the minor lobe 1152-B has a rear-side gain. This first-order directional pattern has a maximum at approximately 137.5 degrees and has a relatively strong directional sensitivity to sound originating from a direction to the left of the subject towards the apparatus 100. The left-front-side-oriented beamformed audio signal 1152 also has a null at 30 degrees that points or is oriented towards the right-side of the subject being recorded, which indicates that there is reduced directional sensitivity to sound originating from the direction to the right-side of the subject. The minor lobe 1152-B has exactly one half of the desired operator sensitivity at 270 degrees in order to pick up an appropriate amount of signal from the operator.

Figure 12B:
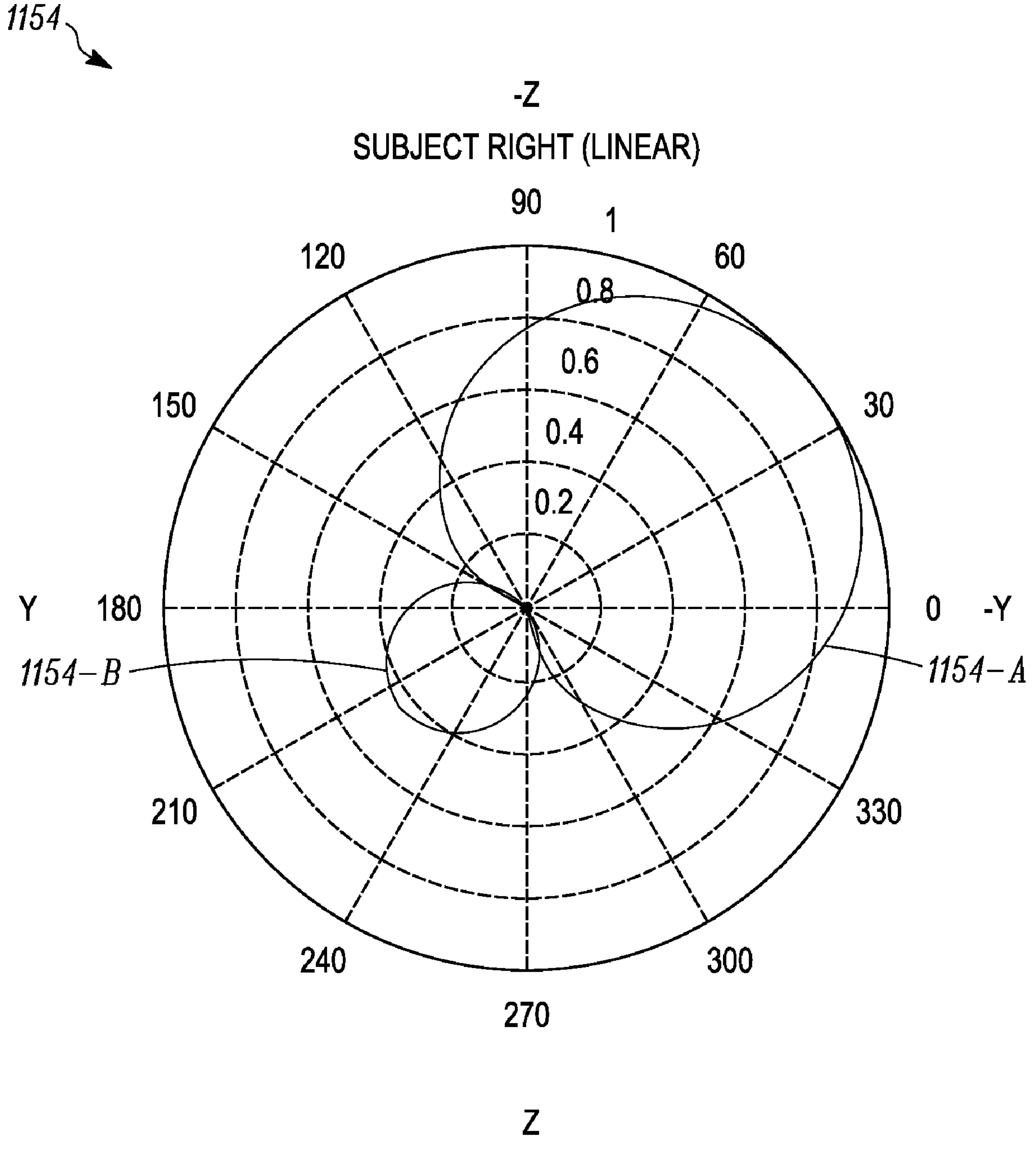
FIG. 12B is an exemplary polar graph of a right-front-side-oriented beamformed audio signal generated by the audio processing system in accordance with one implementation of some of the disclosed embodiments.
Figure 12C:
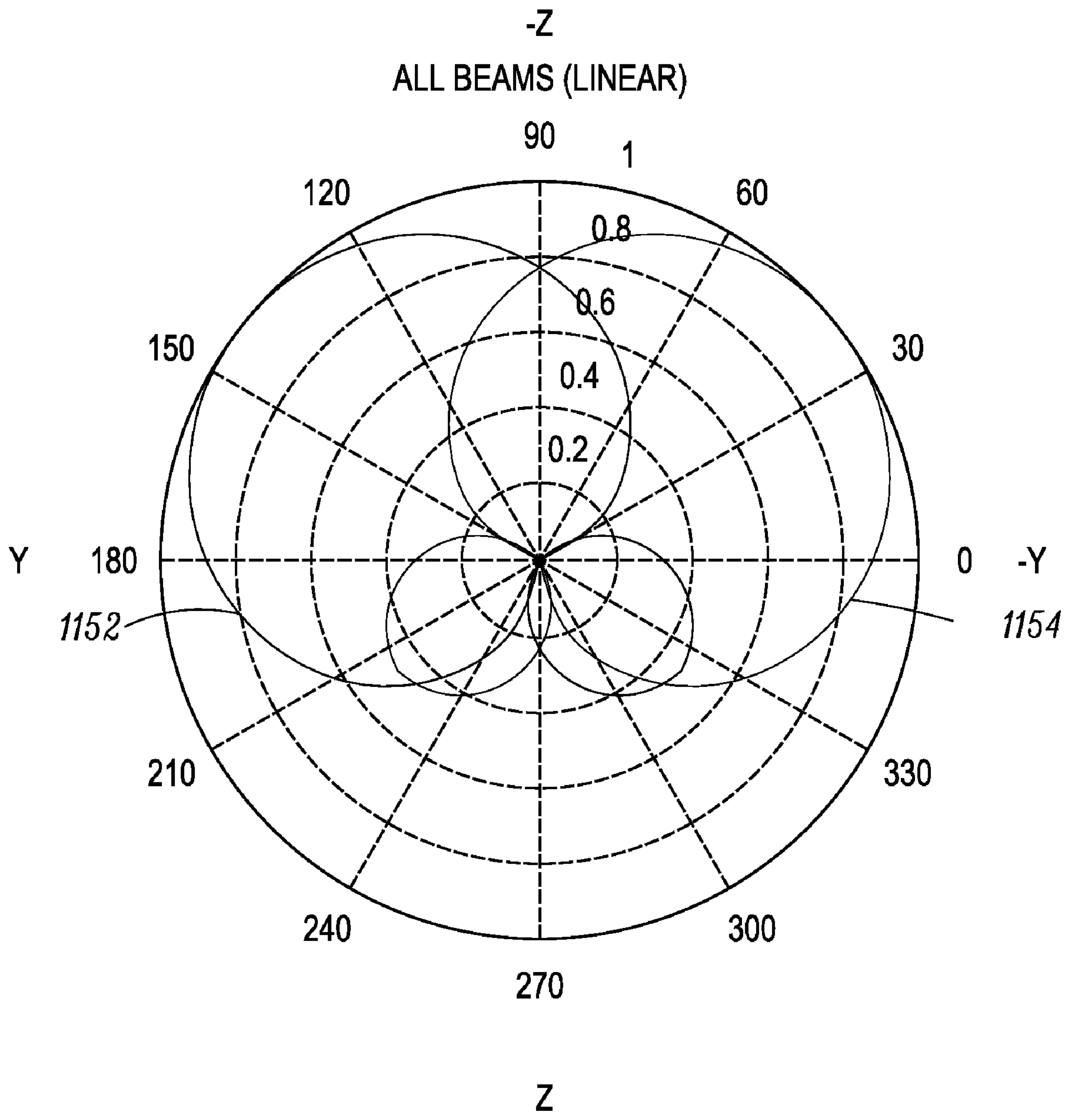
FIG. 12C is an exemplary polar graph of the front-side-oriented beamformed audio signal and the right-front-side-oriented beamformed audio signal when combined as a stereo signal in accordance with one implementation of some of the disclosed embodiments.

FIG. 12B is an exemplary polar graph of a right-front-side-oriented beamformed audio signal 1154 generated by the audio processing system 1100 in accordance with one implementation of some of the disclosed embodiments. As illustrated in FIG. 12B, the right-front-side-oriented beamformed audio signal 1154 has a first-order directional pattern that is oriented or points towards the subject at an angle in front of the device between the −y-direction and the −z-direction. In this particular example, the right-front-side-oriented beamformed audio signal 1154 has a major lobe 1154-A and a minor lobe 1154-B. The major lobe 1154-A has a right-front-side gain and the minor lobe 1154-B has a rear-side gain. In particular, this first-order directional pattern has a maximum at approximately 45 degrees and has a relatively strong directional sensitivity to sound originating from a direction to the right of the subject towards the apparatus 100. The right-front-side-oriented beamformed audio signal 1154 has a null at 150 degrees that is oriented towards the left-side of the subject being recorded, which indicates that there is reduced directional sensitivity to sound originating from the direction to the left-side of the subject. The minor lobe 1154-B has exactly one half of the desired operator sensitivity at 270 degrees in order to pick up an appropriate amount of signal from the operator.

Although not illustrated in FIG. 11, in some embodiments, the beamformed audio signals 1152, 1154 can be combined into a single audio stream or output signal that can be transmitted and/or recorded as a stereo signal. FIG. 12C is a polar graph of exemplary angular or "directional" responses of the left-front-side-oriented beamformed audio signal 1152 and the right-front-side-oriented beamformed audio signal 1154 generated by the audio processing system 1100 when combined as a stereo signal in accordance with one implementation of some of the disclosed embodiments. Although the responses of the left-front-side-oriented beamformed audio signal 1152 and the right-front-side-oriented beamformed audio signal 1154 are shown together in FIG. 12C, it is noted that this not intended to necessarily imply that the beamformed audio signals 1152, 1154 have to be combined in all implementations.

By varying the gains of the lobes of the virtual microphones based on the balancing signal 1164, the ratio of front-side gains and rear-side gains of the beamformed audio signals 1152, 1154 can be controlled so that one does not dominate the other.

As above, although the beamformed audio signals 1152, 1154 shown in FIG. 12A and 12B have a particular first order directional pattern, those skilled in the art will appreciate that the particular types of directional patterns illustrated in FIGS. 12A-12C, for the purpose of illustrating one exemplary implementation, and are not intended to be limiting. The directional patterns can generally have any first order (or higher order) directional beamform patterns and, in some practical implementations, these mathematically idealized beamform patterns may not necessarily be achieved.

Although not explicitly described above, any of the embodiments or implementations of the balancing signals, balancing select signals, and AGC signals that were described above with reference to FIGS. 3-5E can all be applied equally in the embodiments illustrated and described with reference to FIGS. 6-7C, FIGS. 8-10D, and FIGS. 11-12C.

Figure 13:
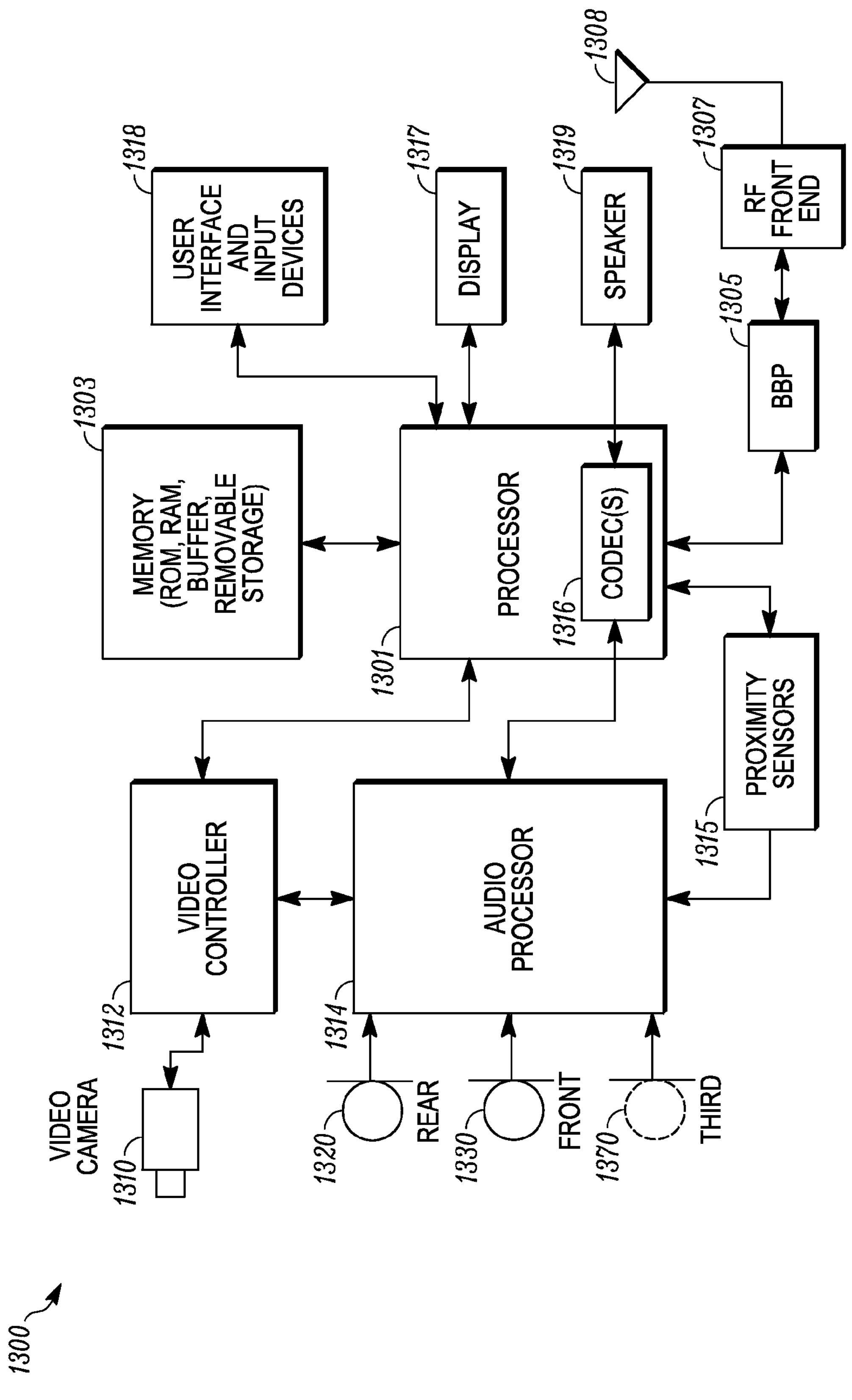
FIG. 13 is a block diagram of an electronic apparatus that can be used in one implementation of the disclosed embodiments.

FIG. 13 is a block diagram of an electronic apparatus 1300 that can be used in one implementation of the disclosed embodiments. In the particular example illustrated in FIG. 13, the electronic apparatus is implemented as a wireless computing device, such as a mobile telephone, that is capable of communicating over the air via a radio frequency (RF) channel.

The wireless computing device 1300 comprises a processor 1301, a memory 1303 (including program memory for storing operating instructions that are executed by the processor 1301, a buffer memory, and/or a removable storage unit), a baseband processor (BBP) 1305, an RF front end module 1307, an antenna 1308, a video camera 1310, a video controller 1312, an audio processor 1314, front and/or rear proximity sensors 1315, audio coders/decoders (CODECs) 1316, a display 1317, a user interface 1318 that includes input devices (keyboards, touch screens, etc.), a speaker 1319 (i.e., a speaker used for listening by a user of the device 1300) and two or more microphones 1320, 1330, 1370. The various blocks can couple to one another as illustrated in FIG. 13 via a bus or other connection. The wireless computing device 1300 can also contain a power source such as a battery (not shown) or wired transformer. The wireless computing device 1300 can be an integrated unit containing at least all the elements depicted in FIG. 13, as well as any other elements necessary for the wireless computing device 1300 to perform its particular functions.

As described above, the microphones 1320, 1330, 1370 can operate in conjunction with the audio processor 1314 to enable acquisition of audio information that originates on the front-side and rear-side of the wireless computing device 1300. The automated balance controller (not illustrated in FIG. 13) that is described above can be implemented at the audio processor 1314 or external to the audio processor 1314. The automated balance controller can use an imaging signal provided from one or more of the processor 1301, the video controller 1312, the proximity sensors 1315, and the user interface 1318 to generate a balancing signal. The audio processor 1314 processes the output signals from the microphones 1320, 1330, 1370 to generate one or more beamformed audio signals, and controls an audio level difference between a front-side gain and a rear-side gain of the one or more beamformed audio signals during processing based on the balancing signal.

The other blocks in FIG. 13 are conventional features in this one exemplary operating environment, and therefore for sake of brevity will not be described in detail herein.

It should be appreciated that the exemplary embodiments described with reference to FIG. 1-13 are not limiting and that other variations exist. It should also be understood that various changes can be made without departing from the scope of the invention as set forth in the appended claims and the legal equivalents thereof. The embodiment described with reference to FIGS. 1-13 can be implemented a wide variety of different implementations and different types of portable electronic devices. While it has been assumed that the rear-side gain should be reduced relative to the front-side gain (or that the front-side gain should be increased relative to the rear-side gain), different implementations could increase the rear-side gain relative to the front-side gain (or reduce the front-side gain relative to the rear-side gain).

Those of skill will appreciate that the various illustrative logical blocks, modules, circuits, and steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. As used herein the term "module" refers to a device, a circuit, an electrical component, and/or a software based component for performing a task. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Furthermore, the connecting lines or arrows shown in the various figures contained herein are intended to represent example functional relationships and/or couplings between the various elements. Many alternative or additional functional relationships or couplings may be present in a practical embodiment.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electronic apparatus having a rear-side and a front-side, the electronic apparatus comprising:

a first microphone that generates a first signal;

a second microphone that generates a second signal;

a third microphone that generates a third signal;

an automated balance controller that generates a balancing signal based on an imaging signal; and a processor, coupled to the first microphone, the second microphone, the third microphone, and the automated balance controller, that processes the first signal, the second signal, and the third signal to generate:

a left-front-side beamformed audio signal having a first major lobe with a left-front-side gain, a right-front-side beamformed audio signal having a second major lobe with a right-front-side gain, and a third beamformed audio signal having a third rear-side gain, wherein an audio level difference between the third rear-side gain and both the right-front-side gain and the left-front-side gain is controlled based on the balancing signal.

2. The electronic apparatus of claim 1, further comprising:

a video camera positioned on the front-side and coupled to the automated balance controller.

3. The electronic apparatus of claim 2, wherein the automated balance controller comprises:

a video controller coupled to the video camera.

4. The electronic apparatus of claim 3, wherein the imaging signal is based on an angular field of view of a video frame of the video camera.

5. The electronic apparatus of claim 3, wherein the imaging signal is based on a focal distance for the video camera.

6. The electronic apparatus of claim 3, wherein the imaging signal is a zoom control signal for the video camera that is controlled by a user interface.

7. The electronic apparatus of claim 6, wherein the zoom control signal for the video camera is a digital-zoom control signal.

8. The electronic apparatus of claim 6, wherein the zoom control signal for the video camera is an optical-zoom control signal.

9. The electronic apparatus of claim 1, further comprising:

a front-side proximity sensor that generates a front-side proximity sensor signal that corresponds to a first distance between a video subject and the electronic apparatus, wherein the imaging signal is based on the front-side proximity sensor signal.

10. The electronic apparatus of claim 1, further comprising:

a rear-side proximity sensor that generates a rear-side proximity sensor signal that corresponds to a second distance between a camera operator and the electronic apparatus, wherein the imaging signal is based on the rear-side proximity sensor signal.

11. The electronic apparatus of claim 1, further comprising:

a front-side proximity sensor that generates a front-side proximity sensor signal that corresponds to a first distance between a video subject and the electronic apparatus; and a rear-side proximity sensor that generates a rear-side proximity sensor signal that corresponds to a second distance between a camera operator and the electronic apparatus, wherein the imaging signal is based on the front-side proximity sensor signal and the rear-side proximity sensor signal.

12. The electronic apparatus of claim 1, wherein the automated balance controller generates a balancing select signal, wherein at least one of the front-side gain and the rear-side gain of the at least one beamformed audio signal is set to a pre-determined value based on the balancing select signal.

13. The electronic apparatus of claim 1, wherein the first microphone or the second microphone is an omnidirectional microphone.

14. The electronic apparatus of claim 1, wherein the first microphone or the second microphone is a directional microphone.

15. The electronic apparatus according to claim 1, wherein the right-front-side beamformed audio signal also has a first minor lobe having a first minor lobe rear-side gain, wherein an audio level difference between the right-front-side gain of the second lobe and the first minor lobe rear-side gain is controlled based on the balancing signal, wherein the left-front-side beamformed audio signal also has a second minor lobe having an other rear-side gain, wherein an audio level difference between the left-front-side gain of the first major lobe and the other rear-side gain of the second minor lobe is controlled based on the balancing signal, and wherein the first minor lobe and the second minor lobe form the third beamformed audio signal.

16. The electronic apparatus according to claim 1, further comprising:

an Automatic Gain Control (AGC) module, coupled to the processor, that receives the at least one beamformed audio signal, and generates an AGC feedback signal based on the at least one beamformed audio signal, wherein the AGC feedback signal is used to adjust the balancing signal.

17. The electronic apparatus according to claim 1, wherein the processor comprises:

a look up table.

18. A method for processing a first microphone signal, second microphone signal, and a third microphone signal comprising:

generating a balancing signal based on an imaging signal; and processing the first microphone signal, the second microphone signal, and the third microphone signal to generate:

a left-front-side beamformed audio signal having a first major lobe with a left-front-side gain, a right-front-side beamformed audio signal having a second major lobe with a right-front-side gain, and a third beamformed audio signal with a third rear-side gain, wherein an audio level difference the third rear-side gain and both the right-front-side gain and the left-front-side gain is controlled based on the balancing signal.

* * * * *